US 8,860,096 B2

(12) United States Patent
Kwon et al.

(10) Patent No.: US 8,860,096 B2
(45) Date of Patent: Oct. 14, 2014

(54) SEMICONDUCTOR DEVICES INCLUDING SRAM CELL AND METHODS FOR FABRICATING THE SAME

(75) Inventors: OhKyum Kwon, Suwon-si (KR); Byungsun Kim, Suwon-si (KR); Taejung Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 694 days.

(21) Appl. No.: 13/009,602

(22) Filed: Jan. 19, 2011

(65) Prior Publication Data
US 2011/0241121 A1    Oct. 6, 2011

(30) Foreign Application Priority Data

Apr. 6, 2010 (KR) ................. 10-2010-0031480

(51) Int. Cl.
*H01L 27/11* (2006.01)
*H01L 27/02* (2006.01)

(52) U.S. Cl.
CPC ......... *H01L 27/1104* (2013.01); *H01L 27/0207* (2013.01); *H01L 27/11* (2013.01); *Y10S 257/909* (2013.01)
USPC .... 257/211; 257/257; 257/909; 257/E21.661; 257/E27.099

(58) Field of Classification Search
None
See application file for complete search history.

(56) References Cited

U.S. PATENT DOCUMENTS

| 6,624,526 | B2 | 9/2003 | Clevenger et al. |
| 2001/0038133 | A1* | 11/2001 | Song ........................ 257/393 |
| 2003/0133335 | A1* | 7/2003 | Ohbayashi et al. ........ 365/200 |
| 2005/0121793 | A1 | 6/2005 | Liaw |
| 2007/0001304 | A1 | 1/2007 | Liaw |

FOREIGN PATENT DOCUMENTS

KR    10-2003-0060142    7/2003

OTHER PUBLICATIONS

English Abstract for Publication No. 10-2003-0060142, Jul. 2003.

* cited by examiner

*Primary Examiner* — Matthew W Such
*Assistant Examiner* — Abul Kalam
(74) *Attorney, Agent, or Firm* — F. Chau & Associates, LLC

(57) ABSTRACT

An SRAM cell of a semiconductor device includes a load transistor, a driver transistor and an access transistor. First source/drains of the load, driver and access transistors are connected to a node. A power line, a ground line and a bit line are electrically connected to second source/drains of the load transistor, the driver transistor and the access transistor. The power line, the ground line and the bit line are disposed at substantially the same level to extend in a first direction. A word line is electrically connected to a gate of the access transistor to extend in a second direction perpendicular to the first direction. The word line is disposed at a different level from the level of the power line, the ground line and the bit line.

12 Claims, 16 Drawing Sheets

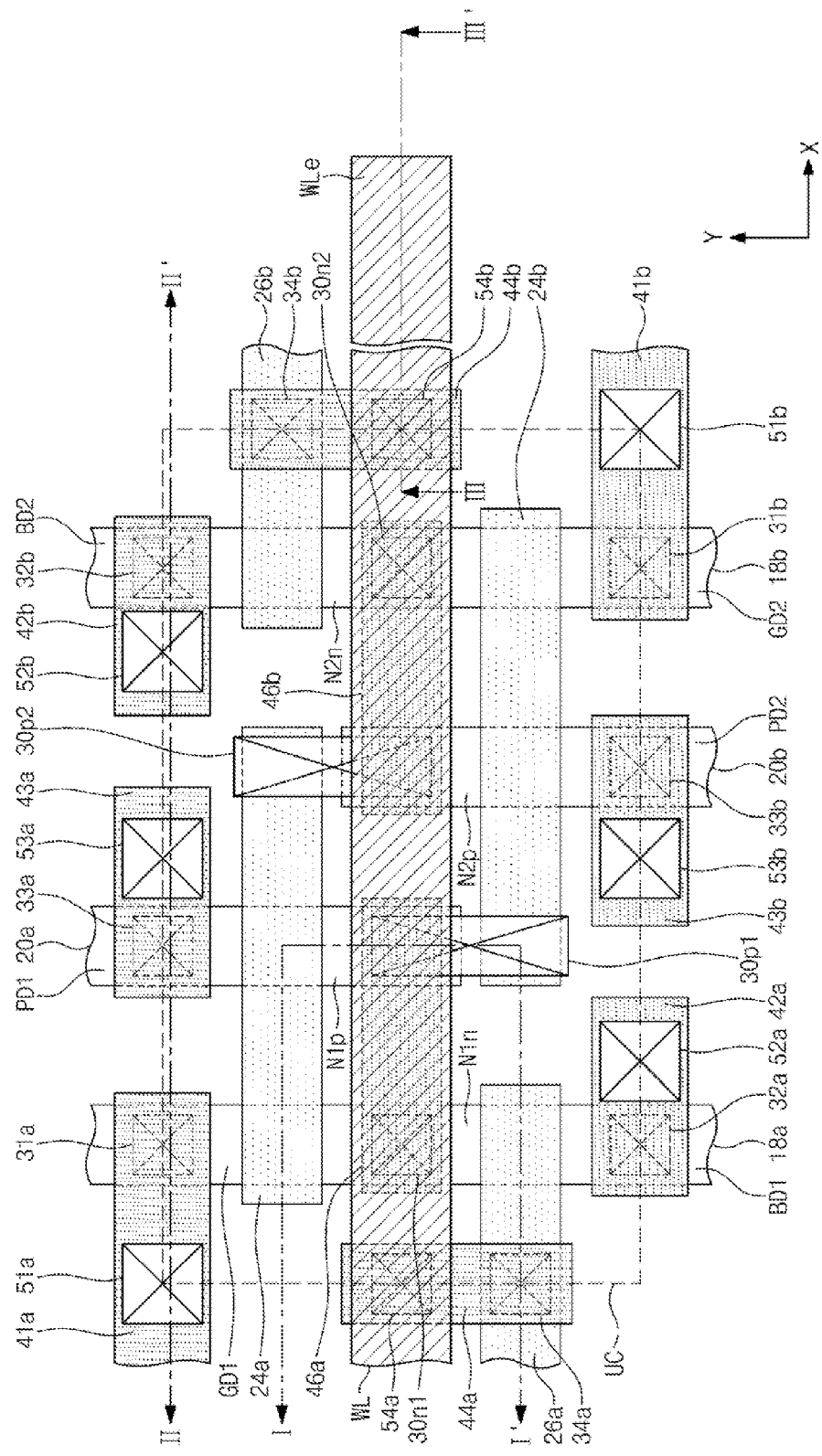

SEMICONDUCTOR DEVICES INCLUDING SRAM CELL AND METHODS FOR FABRICATING THE SAME

CROSS-REFERENCE TO RELATED APPLICATIONS

This patent application claims priority under 35 U.S.C. §119 from Korean Patent Application No. 10-2010-0031480, filed on Apr. 6, 2010, the contents of which are herein incorporated by reference in their entirety.

BACKGROUND

1. Field of the Invention

The present disclosure is directed to semiconductor devices and methods for fabricating the same, and more particularly, to semiconductor devices including an SRAM cell and methods for fabricating the same.

2. Description of the Related Art

Semiconductor devices are light weight, support miniaturization and multiple functions, and are inexpensive, and are widely used in the variety of industries such as electronics appliances, automobiles and vessels. Semiconductor devices may include memory cells. Examples of semiconductor devices having memory cells include semiconductor memory devices, logic devices and driver devices. For example, logic devices may include logic circuits for logical operation and memory cells for storing data required for the logical operation. Similarly, driver devices may include driver circuits and memory cells.

Memory cells may be classified as either nonvolatile memory devices or volatile memory devices. Nonvolatile memory devices can retain data when power is interrupted. Typical examples of a nonvolatile memory cell include a flash memory cell, a phase changeable memory cell, and a magnetic memory cell. Volatile memory devices do not store data when the power is interrupted. Typical examples of a volatile memory cell include a DRAM (Dynamic Random Access Memory) cell and an SRAM (Static Random. Access Memory) cell. An SRAM cell performs higher speed operations relative to the DRAM cell and does not need a refresh operation. Due to the above characteristics of an SRAM cell, some memory devices may include an SRAM cell as a memory cell. However, an SRAM cell may occupy a greater area than a DRAM. Therefore, research has been directed to improving the integration density of SRAMs.

SUMMARY OF THE INVENTION

Embodiments of the inventive concept provide semiconductor devices including an SRAM cell which has superior reliability, and methods for fabricating the same.

Embodiments of the inventive concept also provide semiconductor devices including an SRAM cell which is optimized for high integration, and methods for fabricating the same.

Embodiments of the inventive concept provide semiconductor devices including a SRAM cell. The semiconductor device includes a first load transistor, a first driver transistor and a first access transistor on a substrate, each of the first load, first driver, and first access transistors having a first source/drain and a second source/drain, where the first source/drains are connected to a first node; a power line, a first ground line and a first bit line respectively connected to the second source/drains of the first load transistor, the first driver transistor and the first access transistor, wherein the power line, the first ground line and the first bit line are disposed at substantially a same level to extend in a first direction; and a word line connected to a gate of the first access transistor to extend in a second direction perpendicular to the first direction. The word line may be disposed at a different level from that of the power line, the ground line and the bit line.

In some embodiments, the semiconductor device may further include: a first interlayer dielectric layer on the first load transistor, the first driver transistor and the first access transistor; and a second interlayer dielectric layer disposed on the first interlayer dielectric layer. The word line may be disposed between the first interlayer dielectric layer and the second interlayer dielectric layer, and the power line, the first ground line and the first bit line may be disposed on the second interlayer dielectric layer.

In other embodiments, the semiconductor device may further include: a first power landing plug, a first ground landing plug and a first bit landing plug respectively connected through the first interlayer dielectric layer to the second source/drain of the first load transistor, the second source/drain of the first driver transistor and the second source/drain of the first access transistor; and a first power via plug, a first ground via plug and a first bit via plug respectively connected through the second interlayer dielectric layer to the first power landing plug, the first ground landing plug and the first bit landing plug. The first power via plug, the first ground via plug and the first bit via plug may be respectively connected to the power line, the first ground line and the first bit line, and bottom surfaces of the first power, first ground and first bit via plugs may be narrower than top surfaces of the first power, first ground and first bit landing plugs, respectively.

In still other embodiments, the semiconductor device may further include: a first lower via plug connected to the word line and electrically connected through the first interlayer dielectric layer to the gate of the first access transistor.

In even other embodiments, the semiconductor device may include a first NMOS active region and a first PMOS active region defined by a device isolation pattern disposed on the substrate; a first sharing gate crossing over the first NMOS active region and the first PMOS active region; a first access gate crossing over the first NMOS active region along side of the first sharing gate; a first n-type node doped region formed in the first NMOS active region between the first sharing gate and the first access gate; a first power doped region and a first p-type node doped region formed in the first PMOS active region along both sides of the first sharing gate, respectively; a first ground doped region formed in the first NMOS active region along side of the first sharing gate; and a first bit doped region formed in the first NMOS active region along side of the first access gate. The first driver transistor includes the first n-type node doped region, the first ground doped region, and the first sharing gate crossing over the first NMOS active region. The first load transistor includes the first p-type node doped region, the first power doped region, and the first sharing gate crossing over the first PMOS active region. The first access transistor includes the first n-type node doped region, the first bit doped region, the first access gate crossing over the first NMOS active region along side of the first sharing gate.

In yet other embodiment, the semiconductor device may further include: a lower dielectric layer on the first load, first driver and first access transistors; a first power contact plug, a first ground contact plug and a first bit contact plug respectively connected through the lower dielectric layer to the first power doped region, the first ground doped region and the first bit doped region; a first gate contact plug connected through the lower dielectric layer to the first access gate; a first p-type node contact plug and a first n-type node contact plug respectively connected through the lower dielectric layer to the first p-type node doped region and the first n-type node doped region; a first power pad pattern, a first ground pad pattern, a first bit pad pattern and a first gate pad pattern disposed on the lower dielectric layer and respectively connected to the first power, first ground, first bit and first gate contact plugs; and a first node interconnection disposed on the lower dielectric layer and connected to the first p-type node and the first n-type node contact plugs. The first interlayer dielectric layer may be disposed on the lower dielectric layer, the first pad patterns and the first node interconnection; and the first power landing plug, the first ground landing plug and the first bit landing plug may be respectively connected to the first power pad pattern, the first ground pad pattern and the first bit pad patterns; and the first lower via plug may be connected to the first gate pad pattern.

In further embodiments, the semiconductor device may further include: an upper via plug connected through the second interlayer dielectric layer to an edge of the word line; and an upper interconnection disposed on the second interlayer dielectric layer and connected to the upper via plug. The upper interconnections may be disposed away from the power line, the ground line and the bit line.

In still further embodiments, the semiconductor device may further include: a second load transistor, a second driver transistor and a second access transistor on the substrate, each of the second load, second driver, and second access transistors having a first source/drain and a second source/drain, where the first source/drain are connected to a second node; and a second ground line and a second bit line extending in the first direction and electrically connected to the second source/drains of the second driver transistor and the second access transistor, respectively.

The second ground line and the second bit line may be disposed at substantially the same level as the power line; the first ground line and the first bit line, and the second access transistor includes a gate that may be electrically connected to the word line; and the second source/drain of the second load transistor is electrically connected to the power line.

In even further embodiments, first load transistor and the first driver transistor each include a gate that may be electrically connected to the second node, and the second load transistor and the second driver transistor each include a gate that may be electrically connected to the first node.

In yet further embodiments, a first interlayer dielectric layer is on the second load transistors, the second driver transistors, and the second access transistors.

The second ground line and the second bit line may be disposed on the second interlayer dielectric layer.

In yet further embodiments, the semiconductor device may further include: a second power landing plug, a second ground landing plug and a second bit landing plug electrically connected through the first interlayer dielectric layer to the second source/drain of the second load transistor, the second source/drain of the second driver transistor and the second source/drain of the second access transistor, respectively; and a second power via plug, a second ground via plug and a second bit via plug respectively connected through the second interlayer dielectric layer to the second power landing plug, the second ground landing plug and the second bit landing plug.

The second power via plug, the second ground via plug and the second bit via plug may be respectively connected to the power line, the second ground line and the second bit line. The bottom surfaces of the second power via plug, the second ground via plug and the second bit via plug may be narrower than the top surfaces of the second power landing plug, the second ground landing plug and the second bit landing plug, respectively.

In yet other embodiments, the first bit line and the second bit line may be disposed between the first ground line and the second ground line, and the power line may be disposed between the first bit line and the second bit line.

In yet other embodiments, the substrate may include a plurality of SRAM cells arranged in an SRAM array region, and the SRAM cell array region may have a rectangular shape of which the minor axis corresponds to the first direction and the major axis corresponds to the second direction.

Embodiments of the inventive concept provide methods for fabricating a semiconductor device including a SRAM cell. The method includes: forming one or more load transistors, one or more driver transistors and one or more access transistors on a substrate, each said load transistor, driver transistor, and access transistor having a first source/drain and a second source/drain, where the first source/drains are connected to one or more nodes and where each pair of a driver transistor and an access transistor shares a first source/drain; forming a power line, one or more ground lines and one or more bit lines respectively connected to the second source/drains of each of the load transistors, the driver transistors and the access transistors, wherein the power line, the ground lines and the bit lines are disposed at substantially the same level and extend in a first direction; and forming a word line electrically connected to a gate of each of the access transistors that extends in a second direction perpendicular with the first direction. The word line may be disposed at a different level from that of the power line, the ground line and the bit line.

In some embodiments, the method may further include: forming a first interlayer dielectric layer to cover the load transistor, the driver transistor and the access transistor, wherein the word line is formed on the first interlayer dielectric layer; and forming a second interlayer dielectric layer on the first interlayer dielectric layer and the word line. The power line, the ground lines and the bit lines may be formed on the second interlayer dielectric layer.

In other embodiment, the method may further include: before forming the word line, forming one or more power landing plugs, one or more ground landing plugs, one or more bit landing plugs, and one or more lower via plugs electrically connected through the first interlayer dielectric layer to the second source/drain of each of the load transistors, the driver transistors and the access transistors, and a gate of each of the access transistors, respectively; and after forming the second interlayer dielectric layer, forming one or more power via plugs, one or more ground via plugs and one or more bit via plugs respectively connected through the second interlayer dielectric layer to the power landing plugs, the ground landing plugs and the bit landing plugs. The power line, the ground lines, the bit lines and the word line may be connected to the power via plugs, the ground via plugs, the bit via plugs, and the lower via plugs, respectively, and the bottom surfaces of the power via plugs, the ground via plugs and the bit via plugs may be narrower than the top surfaces of the power landing plugs, the ground landing plugs and the bit landing plugs.

In still other embodiments, the method may further include: forming a base dielectric layer covering the one or more load transistors, the one or more driver transistors and the one or more access transistors; forming one or more ground contact plugs, one or more bit contact plugs, one or more power contact plugs, and one or more gate contact plugs that penetrate the base dielectric layer to respectively connect to the second source/drain of each of the load transistors, the driver transistors and the access transistors, and a gate of each of the access transistors; forming one or more ground pad patterns, one or more bit ground pad patterns, one or more power ground pad patterns, and one or more gate ground pad patterns on the base dielectric layer that respectively cover the one or more bit contact plugs, one or more power contact plugs, and one or more gate contact plugs and respectively connect to the one or more power landing plugs, one or more ground landing plugs, one or more bit landing plugs, and one or more lower via plugs; forming one or more n-type node contact plugs, each respectively connected to the first source/drain shared by an access transistor and a driver transistor; forming one or more p-type node contact plugs, each respectively connecting a first source/drain of a first load transistor with a gate of a second load transistor; and forming a node by connecting each pair of an n-type node contact plug and a p-type node contact plug.

Embodiments of the inventive concept provide an SRAM cell of a semiconductor device. The SRAM cell includes: first and second load transistors, first and second driver transistors and first and second access transistors on a substrate, each load transistor, driver transistor, and access transistor having a first source/drain and a second source/drain, where the first source/drain of the first and second load transistors, first and second driver transistors, and first and second access transistors are respectively connected to a first and second node, and where each respective pair of a first and second driver transistor and a first and second access transistor shares a first source/drain. Each of the first and second load transistor, the first and second driver transistors, and the first and second access transistors may be arranged symmetrically with respect to a center of the SRAM cell. A power line is connected to the second source/drains of the first and second load transistors, and first and second ground lines and first and second bit lines may be respectively connected to the second source/drains of the first and second driver transistors and the first and second access transistors. The power line, the first and second ground lines and the first and second bit lines extend in a first direction; and a word line electrically connected to a gate of each of the first and second access transistors extends in a second direction perpendicular to the first direction.

In some embodiments, the SRAM cell may further include a lower dielectric layer covering the first and second load transistors, the first and second driver transistors, and the first and second access transistors; first and second power contact plugs, first and second ground contact plugs and first and second bit contact plugs respectively connected through the lower dielectric layer to the second source/drains of first and second load transistors, first and second driver transistors and first and second access transistors; first and second gate contact plugs respectively connected through the lower dielectric layer to the gate of each of the first and second access transistors; first and second n-type node contact plugs, each first n-type node contact plug respectively connected to the first source/drain shared by first access transistor and a first driver transistor, each second n-type node contact plug respectively connected to the first source/drain shared by second access transistor and a second driver transistor; first and second p-type node contact plugs, each respectively connecting a first source/drain of a first or second load transistor with a gate of a second or first load transistor; first and second power pad patterns, first and second ground pad patterns, first and second bit pad patterns and first and second gate pad patterns disposed on the lower dielectric layer and respectively connected to the first and second power, first and second ground, first and second bit and first and second gate contact plugs; and first and second node interconnections disposed on the lower dielectric layer and respectively connecting each pair of a first and second n-type node contact plug and a first and second p-type node contact plug, where the first and second nodes are formed by the first and second node interconnection.

In other embodiments, the SRAM cell may further include a first interlayer dielectric layer disposed on the lower dielectric layer, the first and second pad patterns and the first and second node interconnections; and first and second power landing plugs, first and second ground landing plugs, first and second bit landing plugs, and first and second lower via plugs, respectively connected through the first interlayer dielectric layer to the first and second power pad patterns, first and second ground pad patterns, first and second bit pad patterns and first and second gate pad patterns.

In still other embodiments, the SRAM cell may further include a second interlayer dielectric layer disposed on the first interlayer dielectric layer and covering the first and second landing plugs and the first and second via plugs; and first and second power via plugs, first and second ground via plugs, and first and second bit via plugs respectively connected through the second interlayer dielectric layer to the first and second power landing plugs, the first and second ground landing plugs, and the first and second bit landing plugs. The word line may be disposed between the first interlayer dielectric layer and the second interlayer dielectric layer and may be connected to the first and second lower via plugs. The power line, the first and second ground lines and the first and second bit lines may be disposed on the second interlayer dielectric layer, and may be respectively connected to the first and second power via plugs, the first and second ground via plugs, and the first and second bit via plugs.

The bottom surfaces of the first power via plug, the first ground via plug and the first bit via plug may be narrower than top surfaces of the first power landing plug, the first ground landing plug and the first bit landing plug, respectively.

In still other embodiments, the SRAM cell may further include an upper via plug connected through the second interlayer dielectric layer to an edge of the word line; and an upper interconnection disposed on the second interlayer dielectric layer, connected to the upper via plug, and disposed away from the power line, the first and second ground lines, and the first and second bit lines.

The first bit line and the second bit line may be disposed between the first ground line and the second ground line, and the power line may be disposed between the first bit line and the second bit line.

The gate of the first access transistor of the SRAM cell may be connected to a gate of a first access transistor of a first neighboring SRAM cell, and the gate of the second access transistor of the SRAM cell may be connected to a gate of a second access transistor of a second neighboring SRAM cell.

BRIEF DESCRIPTION OF THE DRAWINGS

FIG. 3b is a cross-sectional view taken along the line I-I' of FIG. 3a.

FIG. 3c is a cross-sectional view taken along the line II-II' of FIG. 3a.

FIG. 4b is a cross-sectional view taken along the line I-I' of FIG. 4a.

FIG. 4c is a cross-sectional view taken along the line II-II' of FIG. 4a.

FIG. 5a is plane view illustrating word line contact plugs, word lines and landing contact plugs of an SRAM cell included in a semiconductor device according to an embodiment of the inventive concept.

FIG. 5b is a cross-sectional view taken along the line I-I' of FIG. 5a.

FIG. 5c is a cross-sectional view taken along lines and of FIG. 5a.

FIG. 6b is a cross-sectional view taken along the line I-I' of FIG. 6a.

FIG. 6c is a cross-sectional view taken along lines II-II' and III-III' of FIG. 6a.

FIG. 7b is a cross-sectional view taken along the line I-I' of FIG. 7a.

FIG. 7c is a cross-sectional view taken along lines II-II' and of FIG. 7a.

DETAILED DESCRIPTION OF EXEMPLARY EMBODIMENTS

Exemplary embodiments of the inventive concept will be described below in more detail with reference to the accompanying drawings. The embodiments of the inventive concept may, however, be embodied in different forms and should not be construed as limited to the embodiments set forth herein.

Hereinafter, exemplary embodiments of the inventive concept will be described in detail with reference to the accompanying drawings.

Figure 1:
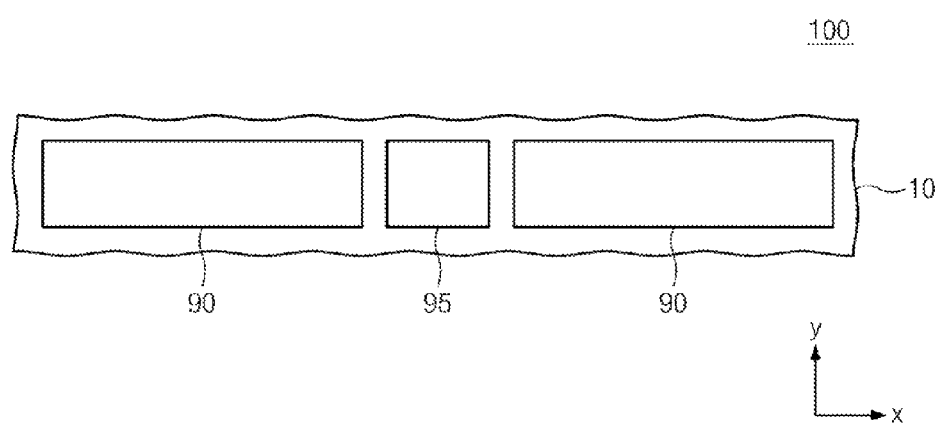
FIG. 1 is a plan view illustrating a semiconductor device according to an embodiment of the inventive concept.

FIG. 1 is a plan view illustrating a semiconductor device according to an embodiment of the inventive concept.

Referring to FIG. 1, a semiconductor device 100 according to an embodiment of the inventive concept includes a semiconductor substrate (hereinafter referred to as 'substrate') 10 on which at least one SRAM cell array region 90 is defined. The substrate 10 may further include at least one logic circuit region 95. A plurality of SRAM cells may be arranged in the SRAM cell array region 90. A logic circuit may be formed in the logic circuit region 95. The semiconductor device 100 may be part of any device having an SRAM cell array region 90 and a logic circuit region 95. For example, the semiconductor device 100 may be an SRAM device. Alternatively, the semiconductor device 100 may be a driving device for operating an electronic appliance, or a display driver integrated circuit.

As shown in FIG. 1, the SRAM cell array region 90 may have a rectangular shape with a minor axis and a major axis in a plan view. The minor axis is parallel with a first direction corresponding to a y-axis in FIG. 1, and the major axis is parallel with a second direction corresponding to an x-axis in FIG. 1 perpendicular to the first direction. The semiconductor device 100 may be formed into rectangular shape extending in the second direction.

An SRAM cell in the SRAM cell array region 90 may be a CMOS SRAM cell. The equivalent circuit diagram is illustrated in FIG. 2.

Figure 2:
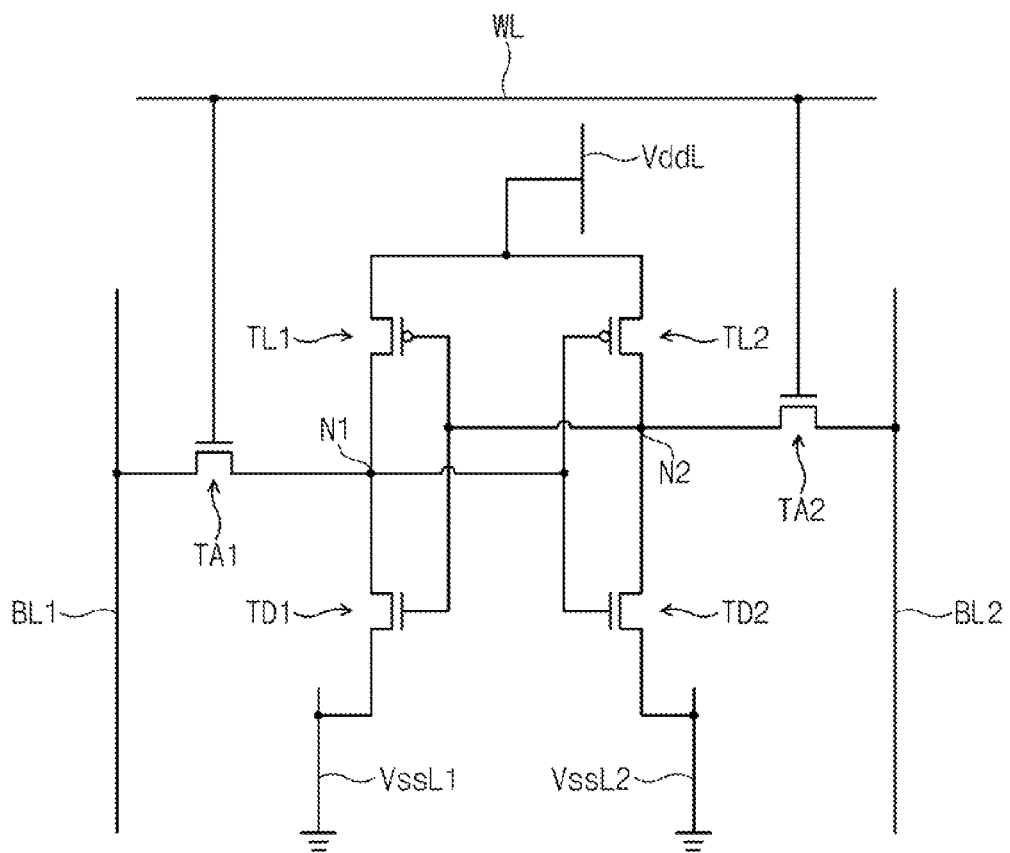
FIG. 2 is a equivalent circuit diagram illustrating an SRAM cell included in a semiconductor device according to an embodiment of the inventive concept.

FIG. 2 is an equivalent circuit diagram illustrating an SRAM cell included in a semiconductor device according to an embodiment of the inventive concept.

Referring to FIG. 2, an SRAM cell according to an embodiment of the inventive concept includes a first load transistor TL1, a first driver transistor TD1, a second load transistor TL2, a second driver transistor TD2, a first access transistor TA1 and a second access transistor TA2. The first and second load transistors TL1 and TL2 are PMOS transistors. The first and second driver transistors TD1 and TD2 and the first and second access transistors TA1 and TA2 are NMOS transistors.

A first source/drain of the first load transistor TL1 and a first source/drain of the first driver transistor TD1 are connected to a first node N1. A second source/drain of the first load transistor TL1 is connected to a power line VddL and a second source/drain of the first driver transistor TD1 is connected to a first ground line VssL1. A gate of the first load transistor TL1 and a gate of the first driver transistor TD1 are electrically connected to each other. Therefore, the first load transistor TL1 and the first driver transistor TD1 may comprise a first inverter. The electrically connected gates of the first load and the first driver transistors TL1 and TD1 may correspond to an input terminal of the first inverter, and the first node N1 may correspond to an output terminal of the first inverter.

A first source/drain of the second load transistor TL2 and a first source/drain of the second driver transistor TD2 are connected to a second node N2. A second source/drain of the second load transistor TL2 is connected to the power line VddL, and a second source/drain of the second driver transistor TD2 is connected to a second ground line VssL2. A gate of the second load transistor TL2 and a gate of the second driver transistor TD2 are electrically connected to each other. Therefore, the second load transistor TL2 and the second driver transistor TD2 may comprise a second inverter. The electrically connected gates of the second load and the second driver transistors TL2 and TD2 may correspond to an input terminal of the second inverter, and the second node N2 may correspond to an output terminal of the second inverter.

The first and the second inverters are coupled with each other to be a latch. Specifically, the gates of the first load and the first driver transistors TL1 and TD1 may be electrically connected to the second node N2, and the gates of the second load and the second driver transistors TL2 and TD2 may be electrically connected to the first node N1. A first source/drain of the first access transistor TA1 is connected to the first node N1, and a second source/drain of the first access transistor TA1 is connected to a first bit line BL1. A first source/drain of the second access transistor TA2 is connected to the second node N2, and a second source/drain of the second access transistor TA2 is connected to a second bit line BL2. Gates of the first and the second access transistors TA1 and TA2 are electrically connected to a word line WL. As the result of the above, the SRAM cell is constructed.

Referring to FIGS. 1 and 2, the power line VddL, the first ground line VssL1, the second ground line VssL2, the first bit line BL1 and the second bit line BL2 may extend in parallel along one direction, such as the y-axis of FIG. 1. Therefore, the power, the first ground, the second ground, the first bit and the second bit lines VddL, VssL1, VssL2, BL1 and BL2 may extend parallel to the minor axis of the SRAM cell array region 90. The word line WL may extend in another direction perpendicular to the above direction, such as the x-axis of FIG. 1. Therefore, the word line WL may extend parallel to the major axis of the SRAM cell array region 90.

According to an embodiment of the inventive concept, the power, the first ground, the second ground, the first bit and the second bit lines VddL, VssL1, VssL2, BL1 and BL2 are disposed at substantially a same level from the substrate surface. The word line WL may be disposed at a level different from that of the power, the first ground, the second ground, the first bit and the second bit lines VddL, VssL1, VssL2, BL1 and BL2.

An SRAM cell equivalent to the circuit diagram in FIG. 2 may be part of many types of devices. An SRAM cell formed on the substrate will be described with reference to FIGS. 3a through 7a.

FIGS. 3a through 7a are plan views illustrating an SRAM cell according to an embodiment of the inventive concept.

Figure 3A:
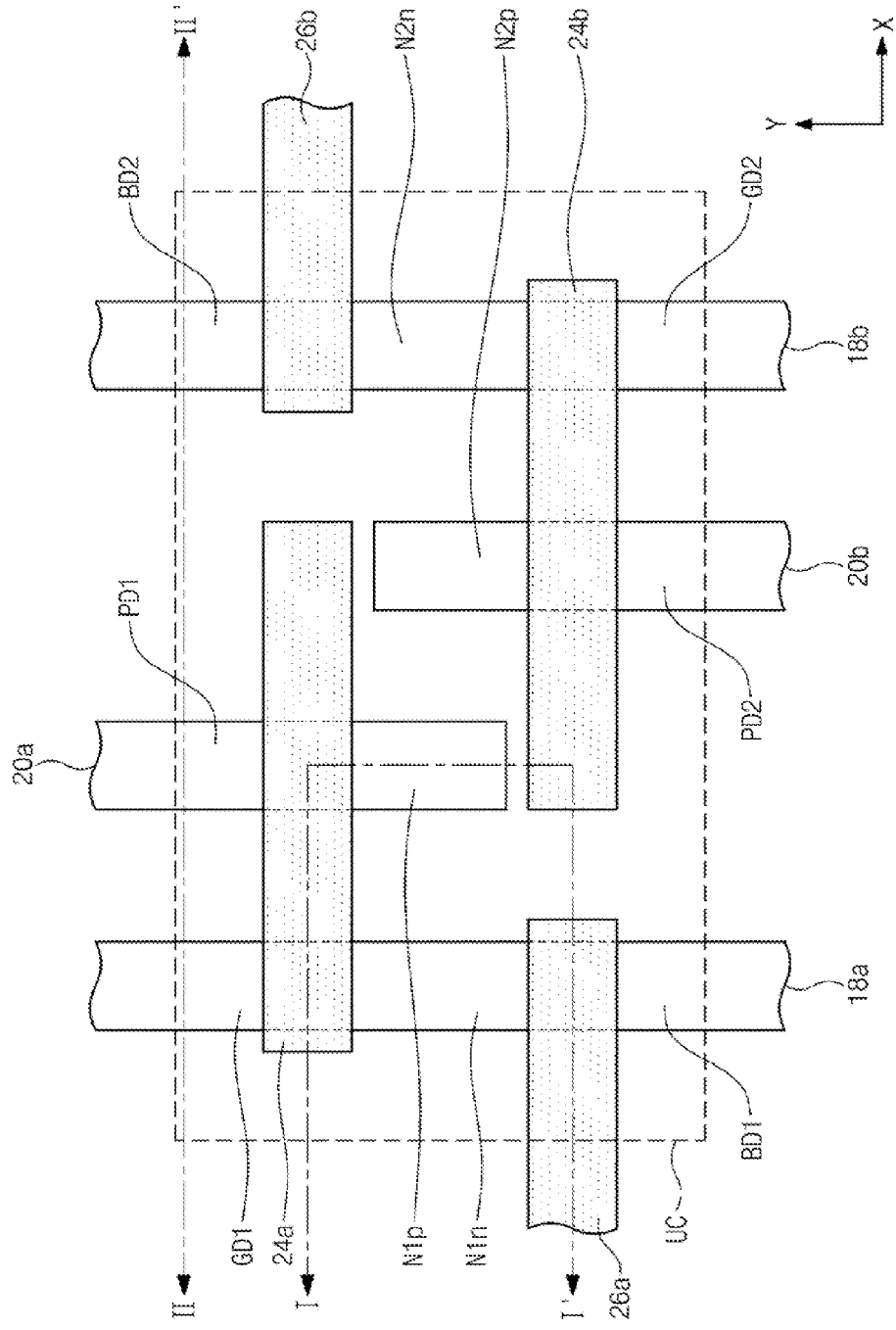
FIG. 3a is a plan view illustrating active regions and gate electrodes of an SRAM cell included in a semiconductor device according to the inventive concept.
Figure 3B:
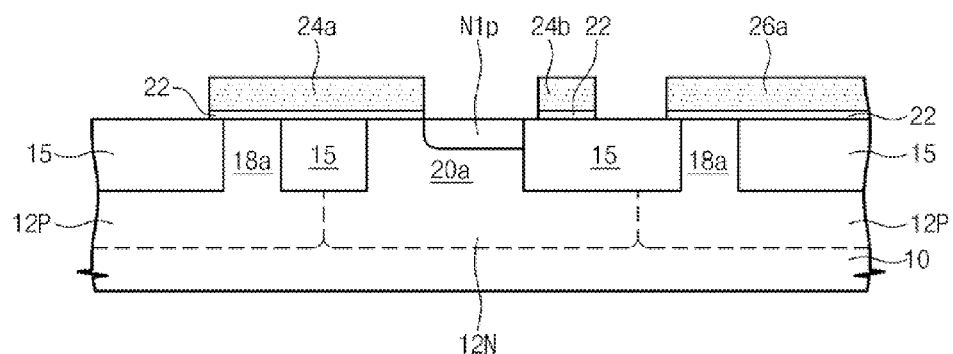

FIG. 3a is a plan view illustrating active regions and gate electrodes of a SRAM cell included in a semiconductor device according to the inventive concept. FIG. 3b is a cross-sectional view taken along the line I-I' of FIG. 3a, and FIG. 3c is a cross-sectional view taken along the line II-II' of FIG. 3a.

Figure 3C:
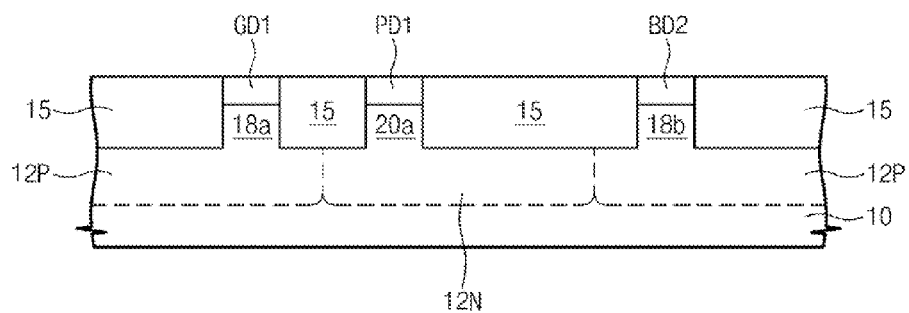

Referring to FIGS. 3a, 3b and 3c, an SRAM cell UC may include active regions 18a, 18b, 20a and 20b which are defined on the substrate 10 and are spaced apart from each other. The active regions 18a, 18b, 20a and 20b are defined by a device isolation pattern 15 which is formed on the substrate 10, and may correspond to portions of the substrate 10 surrounded by the device isolation pattern 15, respectively. The substrate 10 is a semiconductor substrate, such as a silicon substrate, a germanium substrate or a silicon-germanium substrate. The SRAM cell UC is formed in the SRAM cell array region 90 of FIG. 1.

Active regions 18a and 18b are first and second NMOS regions, respectively, that may extend in parallel along the first direction. The first and the second NMOS active regions 18a and 18b may entirely face each other in the second direction. Active regions 20a and 20b are first and second PMOS regions, respectively, and may be disposed between the first and second NMOS active regions 18a and 18b. The first and the second PMOS active regions 20a and 20b may extend in parallel along the first direction. The first and the second PMOS active regions 20a and 20b may partially face each other in the second direction. The first direction may correspond to the direction of the y-axes in FIGS. 1 and 3a, and the second direction may correspond to the direction of the x-axes in FIGS. 1 and 3a.

A plurality of SRAM cells UC may be arranged in the first direction and the second direction on the substrate 10. Thus, the SRAM cells UC may be arranged in two-dimensions on the substrate 10. The SRAM cells may be arranged to have a mirror symmetry in both the first and second directions. The first NMOS active regions 18a of the SRAM cells UC may be connected to each other along the first direction, and the second NMOS active regions 18b of the SRAM cells UC may also be connected to each other along the first direction. The first PMOS active region 20a of the SRAM cell UC may be connected in the first direction to a first PMOS active region of a first neighboring SRAM cell, and the second PMOS active region of the SRAM cell UC may be connected in the first direction a second PMOS active region of a second neighboring SRAM cell. The SRAM cell UC may be disposed between the first and the second neighboring SRAM cells.

Referring to FIGS. 3a, 3b and 3c, the first and the second NMOS active regions 18a and 18b may be doped with p-type dopants, and the first and the second PMOS active regions 20a and 20b may be doped with n-type dopants. For example, as shown in FIG. 3c, a pair of p-well regions 12P may be formed in the substrate 10, the pair of p-well regions 12P are separate from each other, and the first and the second NMOS active regions 18a and 18b may be defined in the pair of p-well regions 12P, respectively. The first and the second PMOS active regions 20a and 20b may be defined in an n-well region 12N which is formed in the substrate 10. The n-well region 12N may be disposed between the pair of p-well regions 12P.

Referring to FIG. 3a, a first sharing gate 24a extends in the second direction to cross over the first NMOS active region 18a and the first PMOS active region 20a. One end of the first sharing gate 24a may be disposed on the device isolation pattern 15 adjacent to, but spaced apart from, an end of the second PMOS active region 20b. A first access gate 26a extends in the second direction to cross over the first NMOS active region 18a. The first sharing gate 24a and the first access gate 26a may be disposed apart from each other in the first active region. A second sharing gate 24b extends in the second direction to cross over the second PMOS active region 20b and the second NMOS active region 18b. One end of the second sharing gate 24b may be disposed on the device isolation pattern 15 adjacent to, but spaced apart from, an end of the first PMOS active region 20a. A second access gate 26b extends in the second direction to cross over the second NMOS active region 18b. The second sharing gate 24b and the second access gate 26b may be disposed apart from each other in the first direction.

The first access gate 26a of the SRAM cell UC may be connected to a first access gate of a first neighboring SRAM cell, and the second access gate 26b of the SRAM cell UC may be connected to a second access gate of a second neighboring SRAM cell. The first sharing gate 24a and the second access gate 26b may be disposed along the second direction. Similarly, the first access gate 26a and the second sharing gate 24b may be disposed along the second direction. Therefore, as shown in FIG. 3a, the first sharing gate 24a and the second sharing gate 24b may be symmetric with respect to the center of the SRAM cell UC. Similarly, the first access gate 26a and the second access gate 26b may also be symmetric with respect to the center of the SRAM cell UC. A gate dielectric layer 22 is disposed between the gates 24a, 24b, 26a and 26b and the active regions 18a, 18b, 20a and 20b.

A first n-type node doped region N1n may be disposed in the first NMOS active region 18a between the first sharing gate 24a and the first access gate 26a. A first ground doped region GD1 may be disposed in the first NMOS active region 18a along side of the first sharing gate 24a. The first sharing gate 24a may be disposed on the first NMOS active region 18a between the first ground doped region GD1 and the first n-type node doped region N1n. A first bit doped region BD1 may be disposed in the first NMOS active region 18a along side of the first access gate 26a. The first access gate 26a may be disposed on the first NMOS active region 18a between the first bit doped region BD1 and the first n-type node doped region N1n. A first p-type node doped region N1p and the first power doped region PD1 may be disposed in the first PMOS active region 20a spaced apart from each other by the first sharing gate 24a. The first sharing gate 24a may be disposed on the first PMOS active region 20a between the first p-type node doped region N1p and the first power doped region PD1.

A second n-type node doped region N2n may be disposed in the second NMOS active region 18b between the second sharing gate 24b and the second access gate 26b, and a second ground doped region GD2 may be disposed in the second NMOS active region 18b along side of the second sharing gate 24b. The second sharing gate 24b may be disposed on the second NMOS active region 18b between the second ground doped region GD2 and the second n-type node doped region N2n. A second bit doped region BD2 may be disposed in the second NMOS active region 18b along side of the second access gate 26b, and the second access gate 26b may be disposed on the second NMOS active region 18b between second bit doped region BD2 and the second n-type node doped region N2n. A second p-type node doped region N2p and a second power doped region PD2 may be disposed in the second PMOS active region 20b spaced apart from each other by the second sharing gate 24b. The second sharing gate 24b may be disposed on the second PMOS active region 20b between the second p-type node doped region N2p and the second power doped region PD2.

The second ground doped region GD2, the second power doped region PD2 and the first bit doped region BD1 may be spaced apart in the second direction. The first ground doped region GD1, the first power doped region PD2 and the second bit doped region BD2 may be spaced apart in the second direction. The first n-type node doped region N1n, the first p-type node doped region N1p, the second p-type node doped region N2p and the second n-type node doped region N2n may be spaced apart in the second direction. The first and the second ground doped regions GD1 and GD2 may be symmetric with respect to the center of the SRAM cell UC, and the first and the second bit doped regions BD1 and BD2 may also be symmetric with respect to the center of the SRAM cell UC. The doped regions GD1, N1n, BD1, GD2, N2n and BD2 in the first and the second NMOS active regions 18a and 18b may be doped with n-type dopants, and the doped regions PD1, N1p, PD2 and N2p in the first and the second PMOS active regions 20a and 20b may be doped with p-type dopants.

Referring to FIGS. 2, 3a, 3b and 3c, the first driver transistor TD1 includes the first n-type node doped region N1n and the first ground doped region GD1. The first driver transistor TD1 also includes the first sharing gate 24a crossing over the first NMOS active region 18a. The first n-type node doped region N1n corresponds to the first source/drain of the first driver transistor TD1, and the first ground doped region GD1 corresponds to the second source/drain of the first driver transistor TD1. The first access transistor TA1 includes the first access gate 26a, the first n-type node doped region N1n and the first bit doped region BD1. The first n-type node doped region N1n corresponds to the first source/drain of the first access transistor TA1. Thus, the first n-type node doped region N1n corresponds to the first source/drain of the first driver transistor TD1 as well as the first source/drain of the first access transistor TA1. The first driver and the first access transistors TD1 and TA1 share the first n-type node doped region N1n. The first load transistor TL1 includes the first sharing gate 24a crossing over the first PMOS active region 20a, the first power doped region PD1 and the first p-type node doped region N1p. The first p-type node doped region N1p corresponds to the first source/drain of the first load transistor TL1, and the first power doped region PD1 corresponds to the second source/drain of the first load transistor TL1.

Similarly, the second driver transistor TD2 includes the second sharing gate 24b crossing over the second NMOS active region 18b, the second n-type node doped region N2n and the second ground doped region GD2. The second n-type node doped region N2n corresponds to the first source/drain of the second driver transistor TD2, and the second ground doped region GD2 corresponds to the second source/drain of the second driver transistor TD2. The second access transistor TA2 includes the second access gate 26b, the second n-type node doped region N2n and the second bit doped region BD2. The second n-type node doped region N2n corresponds to the first source/drain of the second access transistor TA2. Thus, the second driver and the second access transistors TD2 and TA2 share the second n-type node doped region N2n. The second load transistor TL2 includes the second sharing gate 24b crossing over the second PMOS active region 20b, the second power doped region PD2 and the second p-type node doped region N2p. The second p-type node doped region N2p corresponds to the first source/drain of the second load transistor TL2, and the second power doped region PD2 corresponds to the second source/drain of the second load transistor TL2.

The gates 24a, 24b, 26a and 26b are formed of a conductive material. For example, each of the gates 24a, 24b, 26a and 26b may include at least one of a doped semiconductor, a conductive metal nitride (e.g., titanium nitride, tantalum nitride, etc.), a conductive metal-semiconductor compound (e.g., tungsten silicide, cobalt silicide, etc.) and a metal (e.g., titanium, tantalum, tungsten, aluminum, etc.). The gate dielectric layer 22 may include an oxide, a nitride and/or an oxynitride.

According to an embodiment of the inventive concept, after the well regions 12N and 12P are formed, the device isolation pattern 15 may be formed to define the active regions 18a, 18b, 20a and 10b. Subsequently, the gate dielectric layer 22 and the gates 24a, 24b, 26a and 26b may be formed. The doped regions GD1, N1n, BD1, GD2, N2n and BD2 may be formed in the NMOS active regions 18a and 18b, and the doped regions PD1, N1p, PD2 and N2p may be formed in the PMOS active regions 20a and 20b. The doped regions PD1, N1p, PD2 and N2p in the PMOS active regions 20a and 20b may be formed after the doped regions GD1, N1n, BD1, GD2, N2n and BD2 in the NMOS active regions 18a and 18b are formed. Alternatively, the doped regions GD1, N1n, BD1, GD2, N2n and BD2 in the NMOS active regions 18a and 18b may be formed after the doped regions PD1, N1p, PD2 and N2p in the PMOS active regions 20a and 20b are formed.

Figure 4A:
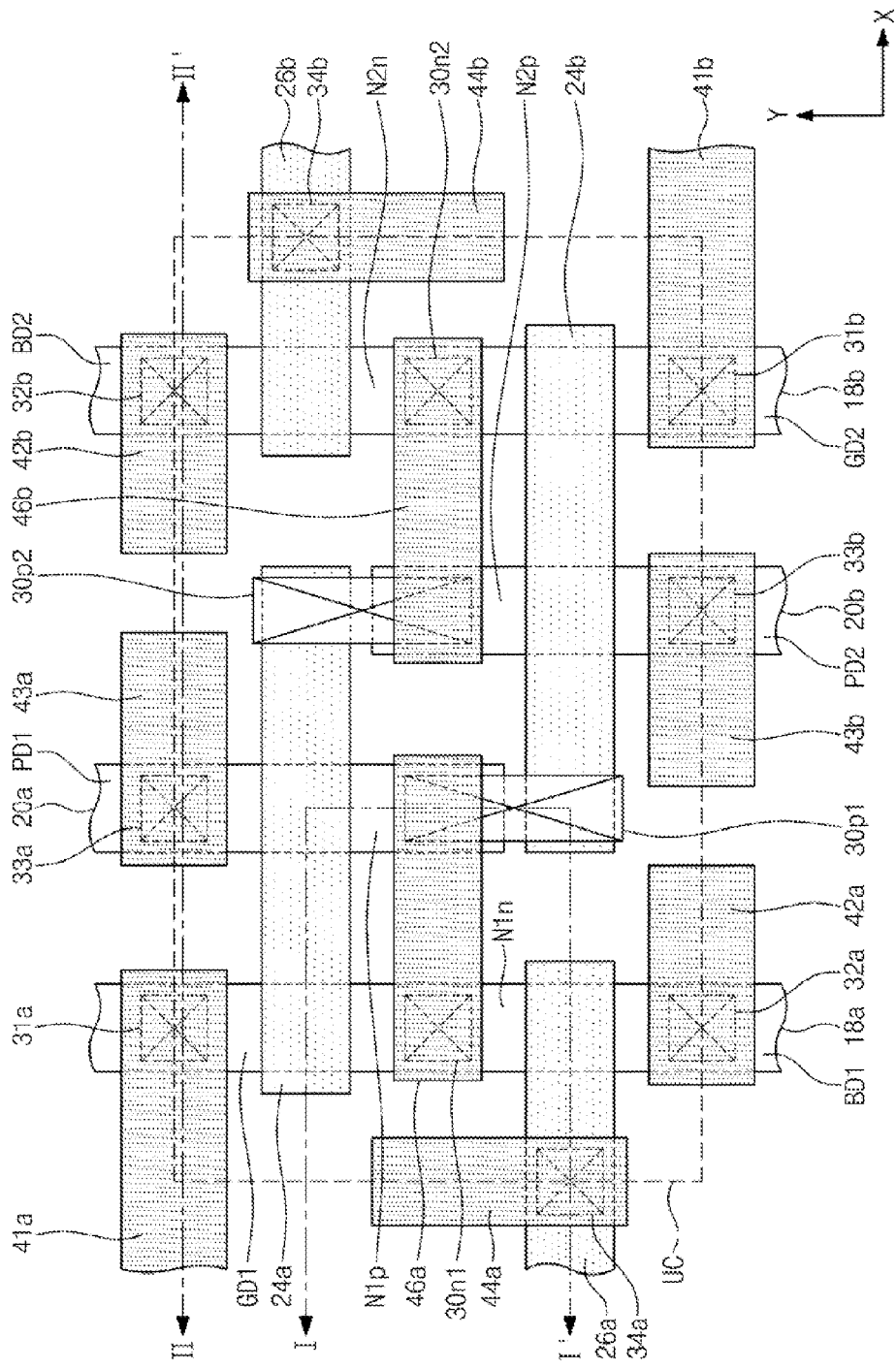
FIG. 4a is a plan view illustrating pad contact plugs, node contact plugs, node interconnections and pad patterns of an SRAM cell included in a semiconductor device according to an embodiment of the inventive concept.
Figure 4B:
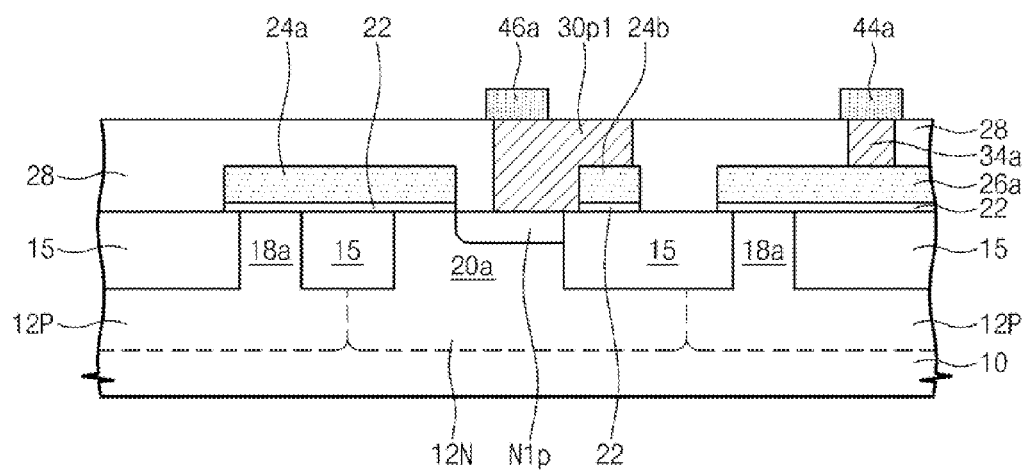

FIG. 4a is a plan view illustrating pad contact plugs, node contact plugs, node interconnections and pad patterns of an SRAM cell included in a semiconductor device according to an embodiment of the inventive concept. FIG. 4b is a cross-sectional view taken along the line of FIG. 4a and FIG. 4c is a cross-sectional view taken along the line II-II' of FIG. 4a.

Figure 4C:
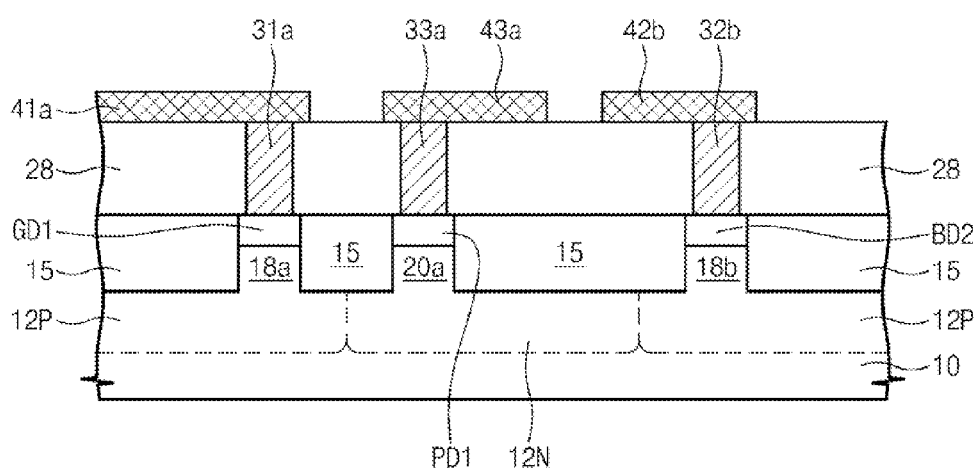

Referring to FIGS. 4a, 4b and 4c, a base dielectric layer 28 may be formed on the substrate 10. The base dielectric layer 28 covers the first and the second access transistors TA1 and TA2, the first and the second driver transistors TD1 and TD2, and the first and the second load transistors TL1 and TL2. Thus, the base dielectric layer 28 cover the gates 24a, 24b, 26a and 26b and the doped regions GD1, N1n, BD1, GD2, N2n, BD2, PD1, N1p, PD2 and N2p.

Contact plugs 30n1, 30p1, 31a, 32a, 33a, 34a, 30n2, 30p2, 31b, 32b, 33b and 34b may be formed to penetrate the base dielectric layer 28. The contact plugs 30n1, 30p1, 31a, 32a, 33a, 34a, 30n2, 30p2, 31b, 32b, 33b and 34b are spaced apart from each other. A first n-type node contact plug 30n1 is connected to the first n-type node doped region N1n. A first p-type node contact plug 30p1 connects the second sharing gate 24b and the first p-type node doped region N1p. A first ground contact plug 31a is connected to the first doped region GD1, a first bit contact plug 32a is connected to the first bit doped region BD1, and a first power contact plug 33a is connected to the first power doped region PD1. A first gate contact plug 34a is connected to the first access gate 26a. A second n-type node contact plug 30n2 is connected to the second n-type node doped region N2n. A second p-type node contact plug 30p2 connects the first sharing gate 24a and the second p-type node doped region N2p. A second ground contact plug 31b is connected to the second ground doped region GD2, a second bit contact plug 32b is connected to the second bit doped region BD2 and a second power contact plug 33b is connected to the second power doped region PD2. A second gate contact plug 34b is connected to the second access gate 26b. As shown in FIG. 4a, each of the first ground, the first bit, the first power, the second ground, the second bit, the second power, the first gate and the second gate contact plugs 31a, 32a, 33a, 31b, 32b, 33b, 34a and 34b may belong to neighboring SRAM cells.

The contact plugs 30n1, 30p1, 31a, 32a, 33a, 34a, 30n2, 30p2, 31b, 32b, 33b and 34b may be simultaneously formed of the same material. For example, the contact plugs 30n1, 30p1, 31a, 32a, 33a, 34a, 30n2, 30p2, 31b, 32b, 33b and 34b may be formed of at least one of a conductive metal nitride (e.g., titanium nitride, tantalum nitride, etc.), a conductive metal-semiconductor compound (e.g., titanium silicide, cobalt silicide, etc.) and a metal (e.g., titanium, tantalum, tungsten, etc.).

Pad patterns 41a, 42a, 43a, 44a, 41b, 42b, 43b and 44b and node interconnections 46a and 46b may be formed on the base dielectric layer 28. The pad patterns 41a, 42a, 43a, 44a, 41b, 42b, 43b and 44b and node interconnections 46a and 46b may be disposed at substantially the same level from the top surface of the substrate 10. The first node interconnection 46a connects the first n-type and the first p-type node contact plugs 30n1 and 30p1. The first node interconnection 46a may be in contact with the entire top surface of the first n-type node contact plug 30n1, but with only a portion of the top surface of the first p-type node contact plug 30p1. The second node interconnection 46b connects the second n-type and the second p-type node contact plugs 30n2 and 30p2. The second node interconnection 46b may be in contact with the entire top surface of the second n-type node contact plug 30n2, but with only a portion of the top surface of the second p-type node contact plug 30p2. The first node N1 of FIG. 2 may be formed by the first node interconnection 46a, and the second node N2 of FIG. 2 may be formed by the second node interconnection 46b.

A first ground pad pattern 41a is connected to a top surface of the first ground contact plug 31a, a first bit pad pattern 42a is connected to a top surface of the first bit contact plug 32a, and a first power pad pattern 43a is connected to a top surface of the first power contact plug 33a. A first gate pad pattern 44a is connected to a top surface of the first gate contact plug 34a. A second ground pad pattern 41b is connected to a top surface of the second ground contact plug 31b, a second bit pad pattern 42b is connected to a top surface of the second bit contact plug 32b, and the second power pad pattern 43b is connected to a top surface of the second power contact plug 33b. A second gate pad pattern 44b is connected to a top surface of the second gate contact plug 34b.

The pad patterns 41a, 42a, 43a, 44a, 41b, 42b, 43b and 44b and node interconnections 46a and 46b may include at least one of a conductive metal nitride (e.g., titanium nitride, tantalum nitride, etc.), a conductive metal-semiconductor compound (e.g., titanium silicide, cobalt silicide, etc.) and a metal (e.g., titanium, tantalum, tungsten, etc.).

Figure 5B:
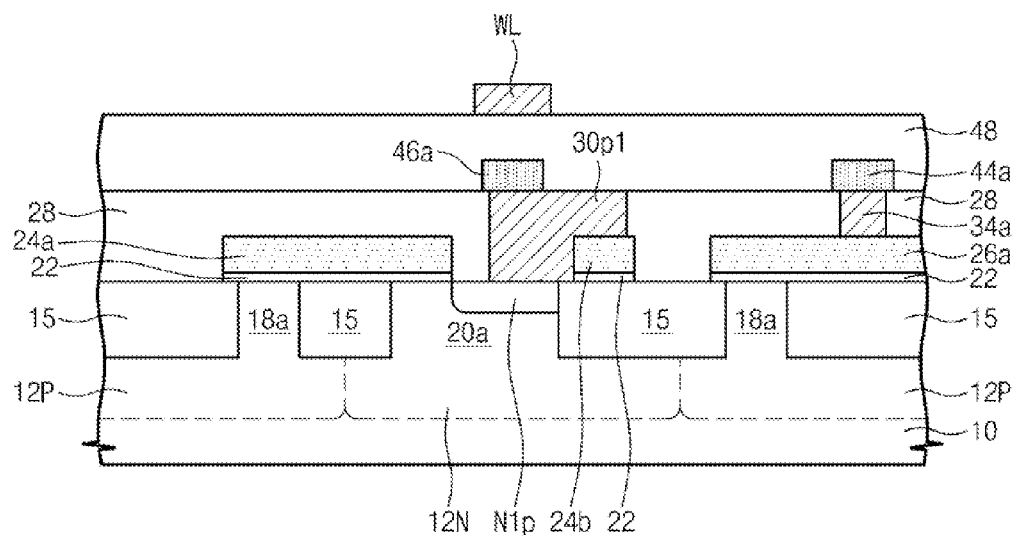
Figure 5C:
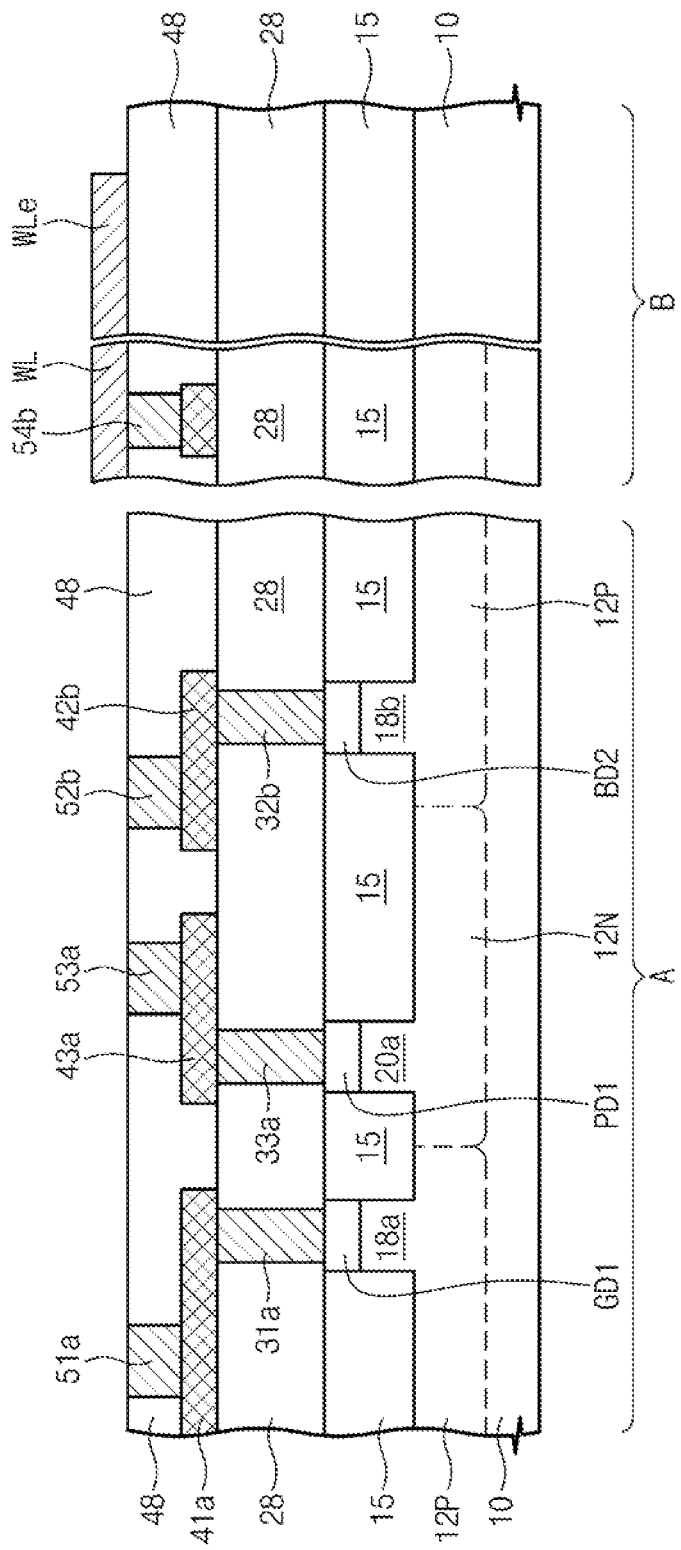

FIG. 5a is plane view illustrating word line contact plugs, word lines and landing contact plugs of an SRAM cell included in a semiconductor device according to an embodiment of the inventive concept. FIG. 5b is a cross-sectional view taken along the line I-I' of FIG. 5a, and FIG. 5c is a cross-sectional view taken along lines II-II' and III-III' of FIG. 5a. The reference symbol A of FIG. 5c is a cross-sectional view taken along the line II-II' of FIG. 5a, the reference symbol B of FIG. 5c is a cross-sectional view taken along the line III-III' of FIG. 5a.

Referring to FIGS. 5a, 5b and 5c, a first interlayer dielectric layer 48 may be formed on the substrate 10. As shown in FIGS. 5b and 5c, the first interlayer dielectric layer 48 may cover the pad patterns 41a, 42a, 43a, 44a, 41b, 42b, 43b and 44b, the node interconnections 46a and 46b, and the base dielectric layer 28. The first interlayer dielectric layer 48 may be formed after the pad patterns 41a, 42a, 43a, 44a, 41b, 42b, 43b and 44b and the node interconnections 46a and 46b are formed. The first interlayer dielectric layer 48 may include an, oxide, a nitride, and/or an oxynitride.

Landing plugs 51a, 52a, 53a, 51b, 52b and 53b and lower via plugs 54a and 54b may be formed through first interlayer dielectric layer 48. A first ground landing plug 51a is connected to the first ground pad pattern 41a, a first bit landing plug 52a is connected to the first bit pad pattern 42a, and a first power landing plug 53a is connected to the first power pad pattern 43a. A first lower via plug 54a is connected to the first gate pad pattern 44a. A second ground landing plug 51b is connected to the second ground pad pattern 41b, a second bit landing plug 52b is connected to the second bit pad pattern 42b, and a second power landing plug 53b is connected to the second power pad pattern 43b. A second lower via plug 54a is connected to the second gate pad pattern 44b.

As shown in FIGS. 5a and 5c, top surface of each landing plugs 51a, 52a, 53a, 51b, 52b and 53b may be wider than that of each lower via plugs 54a and 54b. Four neighboring SRAM cells may share the first ground landing plug 51a. Similarly, four neighboring SRAM cells may also share the second ground landing plug 51b. Two adjacent SRAM cells may share the first bit, the second bit, the first power and the second power landing plugs 52a, 52b, 53a and 53b. The first lower via plug 54a and the second via plug 54b may be spaced apart in the second direction.

The landing plugs 51'a, 52a, 53a, 51b, 52b and 53b and the lower via plugs 54a and 54b may be simultaneously formed of the same material. For example, the landing plugs 51a, 52a, 53a, 51b, 52b and 53b and the lower via plugs 54a and 54b may include one of a conductive metal nitride (e.g., titanium nitride, tantalum nitride, etc.), a conductive metal-semiconductor compound (e.g., titanium silicide, cobalt silicide, etc.) and a metal (e.g., titanium, tantalum, tungsten, etc.).

A word line WL is formed on the first interlayer dielectric layer 48. The word line WL extends in the second direction corresponding to the x-axis of FIG. 1. Therefore, the word line WL may extend parallel to the major axis of the rectangular shaped SRAM region 90 of FIG. 1. The word line WL may be connected to top surfaces of the first and the second lower via plugs 54a and 54b. Thus, the word line WL may be electrically connected to the first and the second access gates 26a and 26b that correspond to gates of the first and the second access transistors, respectively. One end WLe of the word line WL may be disposed on the SRAM cell array region 90 of FIG. 1 or extend out of the SRAM cell array region 90 of FIG. 1.

The word line WL may be formed after the landing plugs 51a, 52a, 53a, 51b, 52b and 53b and the lower via plugs 54a and 54b are formed. The word line WL may include a conductive material with a low resistivity. For example, the word line WL may include aluminum, alloyed aluminum, copper and/or alloyed copper. In addition, the word line WL may further include a conductive metal nitride (e.g., titanium nitride, tantalum nitride, etc.) and/or an adhesive layer (e.g., titanium, tantalum, etc.) that may be used as barrier metal.

Figure 6A:
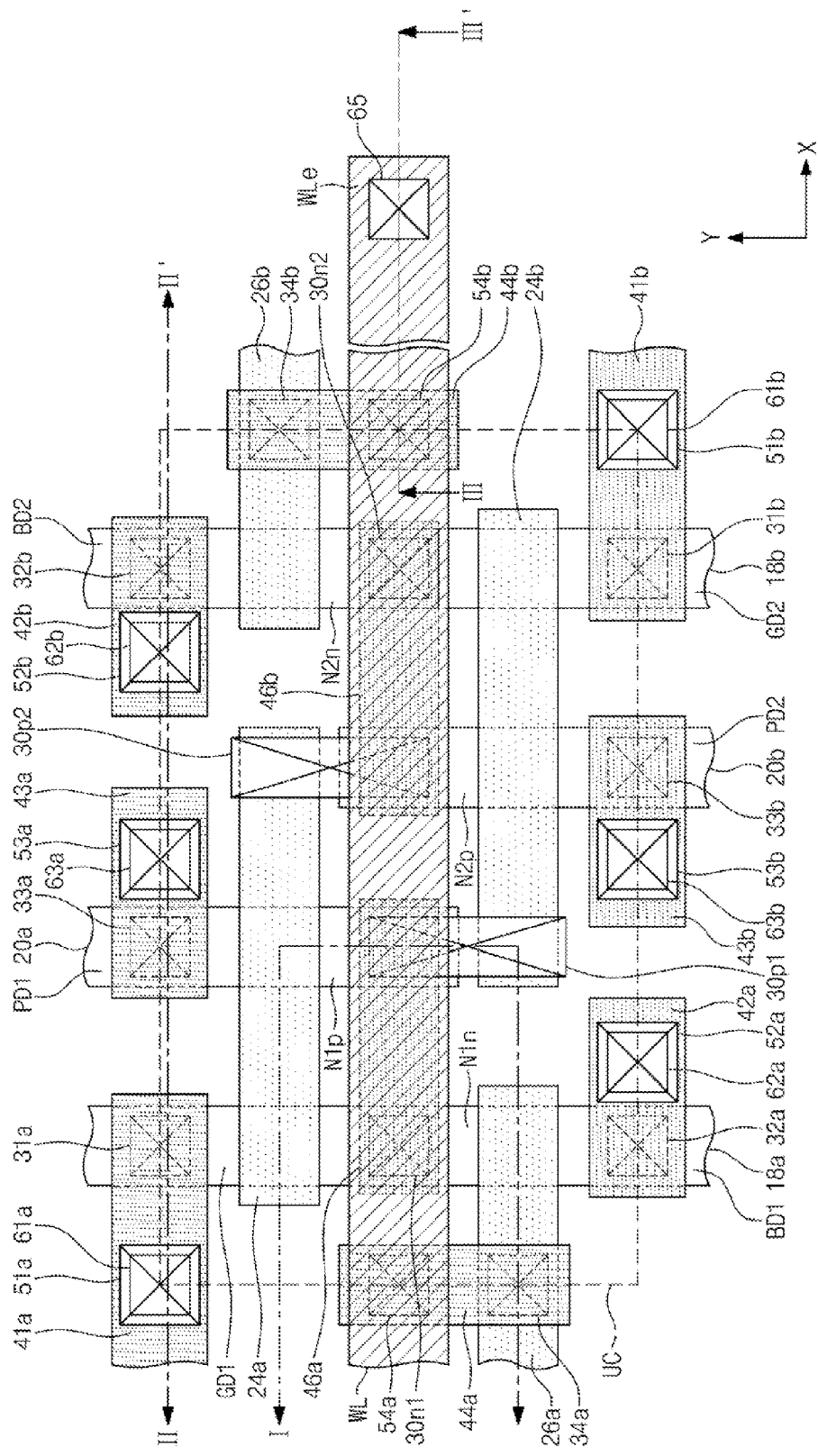
FIG. 6a is a plan view illustrating via plugs of an SRAM cell included in a semiconductor device according to an embodiment of the inventive concept.
Figure 6B:
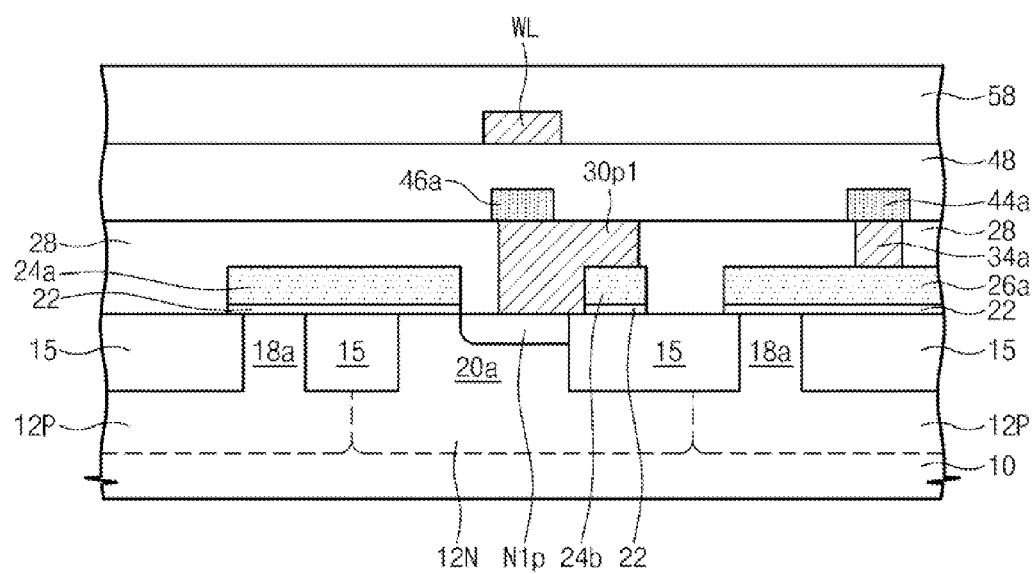
Figure 6C:
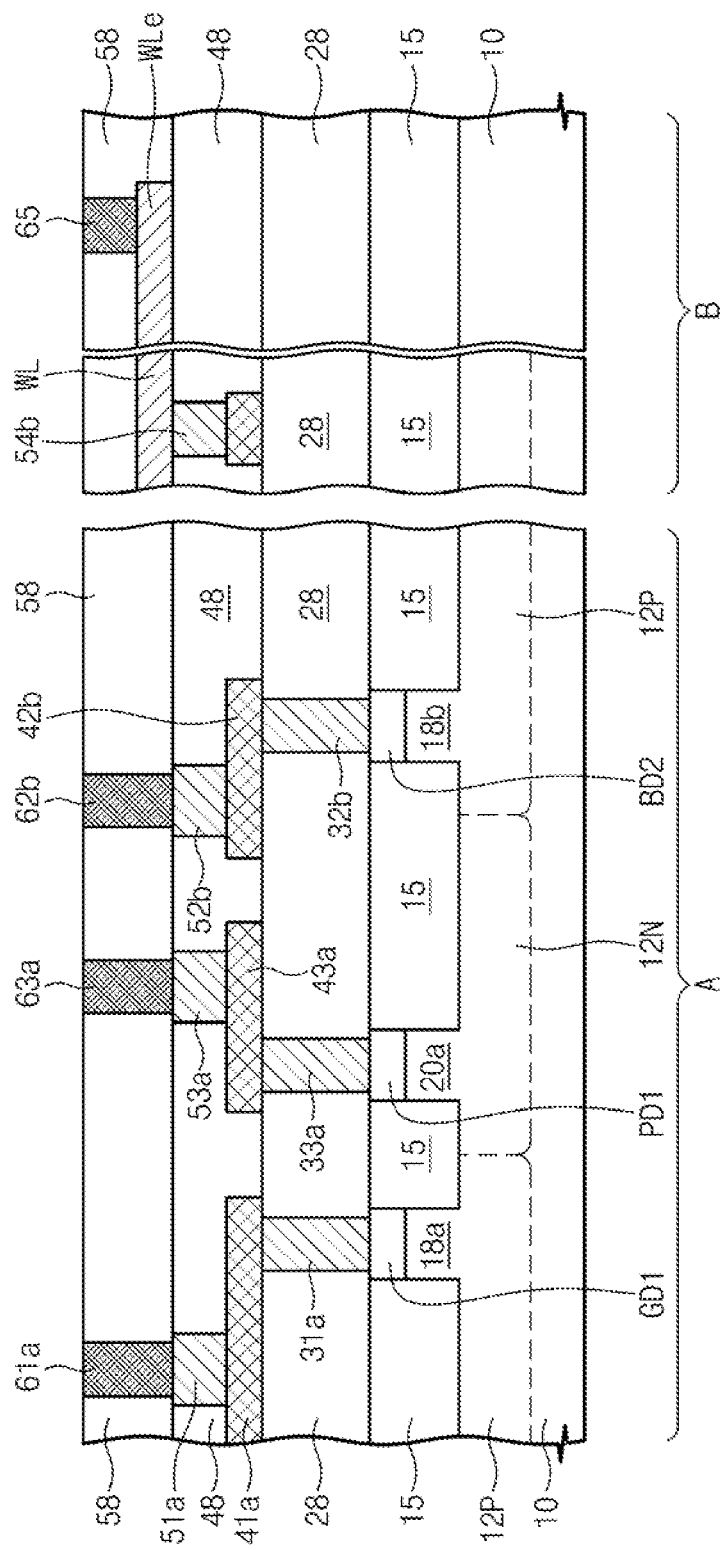

FIG. 6a is a plan view illustrating via plugs of an SRAM cell included in a semiconductor device according to an embodiment of the inventive concept. FIG. 6b is a cross-sectional view taken along the line I-I' of FIG. 6a, FIG. 6c is a cross-sectional view taken along lines II-II' and of FIG. 6a. Similar to FIG. 5c, reference symbols A and B of FIG. 6c respectively illustrate cross-sectional views taken along lines II-II' and III'-III' of FIG. 6a.

Referring to FIGS. 6a, 6b and 6c, a second interlayer dielectric layer 58 may be formed on the substrate 10. The second interlayer dielectric layer 58 may be formed after the word line WL is formed. Therefore, the second interlayer dielectric layer 58 may cover the word line WL, the landing plugs 51a, 52a, 53a, 51b, 52b and 53b and the first interlayer dielectric layer 48. The second interlayer dielectric layer 58 may include an oxide, a nitride and/or an oxynitride.

Via plugs 61a, 62a, 63a, 61b, 62b and 63b may be formed through the second interlayer dielectric layer 58. A first ground via plug 61a is connected directly to the top surface of the first ground landing plug 51a. A first bit via plug 62a is connected directly to the top surface of the first bit landing plug 52a, and a first power via plug 63a is connected directly to the first power landing plug 53a. Bottom surfaces of first ground via plug 61a, the first bit via plug 62a and the first power via plug 63a may be narrower than top surfaces of first ground landing plug 51a, the first bit landing plug 52a and the first power landing plug 53a, respectively.

A second ground via plug 61b is connected directly to the top surface of the second ground landing plug 51b, a second bit via plug 62b is connected directly to the top surface of the second bit landing plug 52b, and a second power via plug 63b is connected directly to the top surface of the second power landing plug 53b. Bottom surfaces of the second ground via plug 61b, the second bit via plug 62b and the second power via plug 63b may be narrower than top surfaces of the second ground landing plug 51b, the second bit landing plug 52b and the second power landing plug 53b, respectively.

The first power via plug 63a and the second power via plug 63b may be spaced apart in the first direction corresponding to the y-axis of the drawings.

An upper via plug 65 may be connected to an end WLe of the word line WL. The upper via plug 65 may be formed simultaneously with other via plugs 61a, 62a, 63a, 61b, 62b and 63b. The bottom surface of the upper via plug 65 may have substantially the same area as the bottom surfaces of each of the via plugs 61a, 62a, 63a, 61b, 62b and 63b. The via plugs 61a, 62a, 63a, 61b, 62b, 63b and 65 may include at least one of a conductive metal nitride (e.g., titanium nitride, tantalum nitride, etc.), a conductive metal-semiconductor compound (e.g., titanium silicide, cobalt silicide, etc.) and a metal (e.g., titanium, tantalum, tungsten, etc.).

Figure 7A:
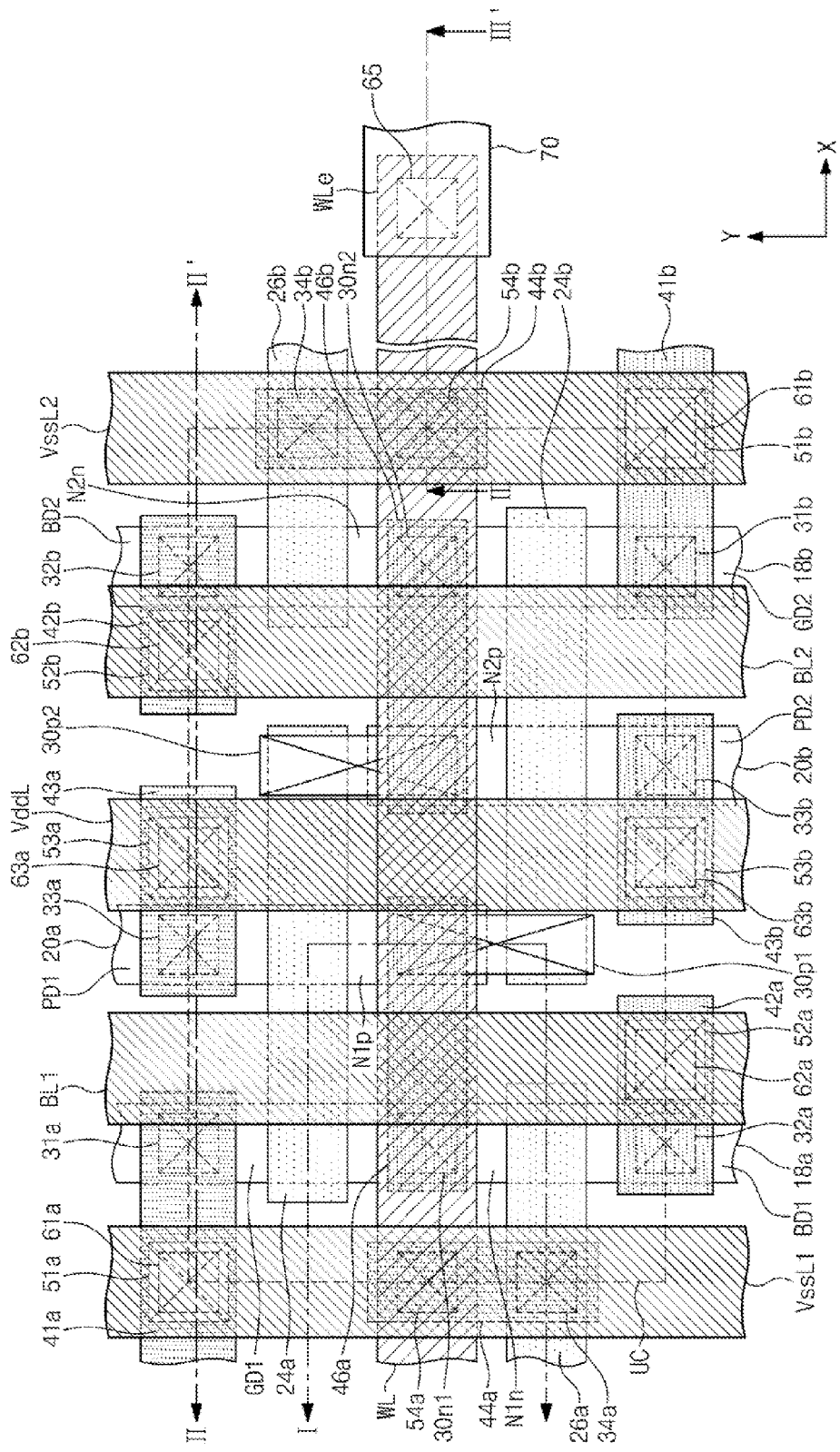
FIG. 7a is a plan view illustrating power lines, ground lines and bit lines of an SRAM cell included in a semiconductor device according to an embodiment of the inventive concept.
Figure 7B:
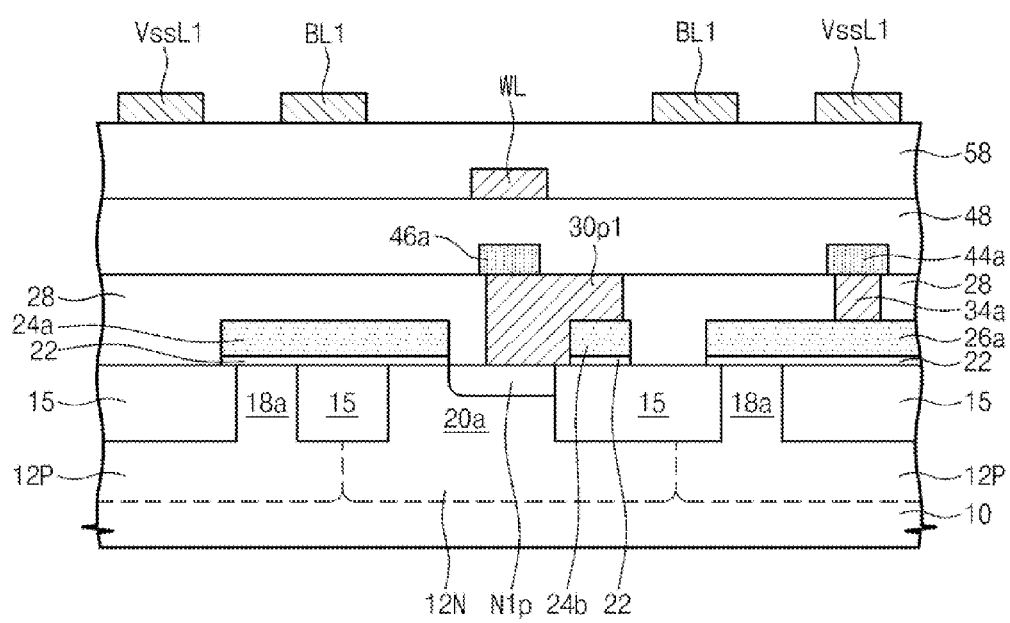

FIG. 7a is a plan view illustrating power lines, ground lines and bit lines of an SRAM cell included in a semiconductor device according to an embodiment of the inventive concept: FIG. 7b is a cross-sectional view taken along the line I-I' of FIG. 7a and FIG. 7c is a cross-sectional view taken along lines II-II' and of FIG. 7a.

Figure 7C:
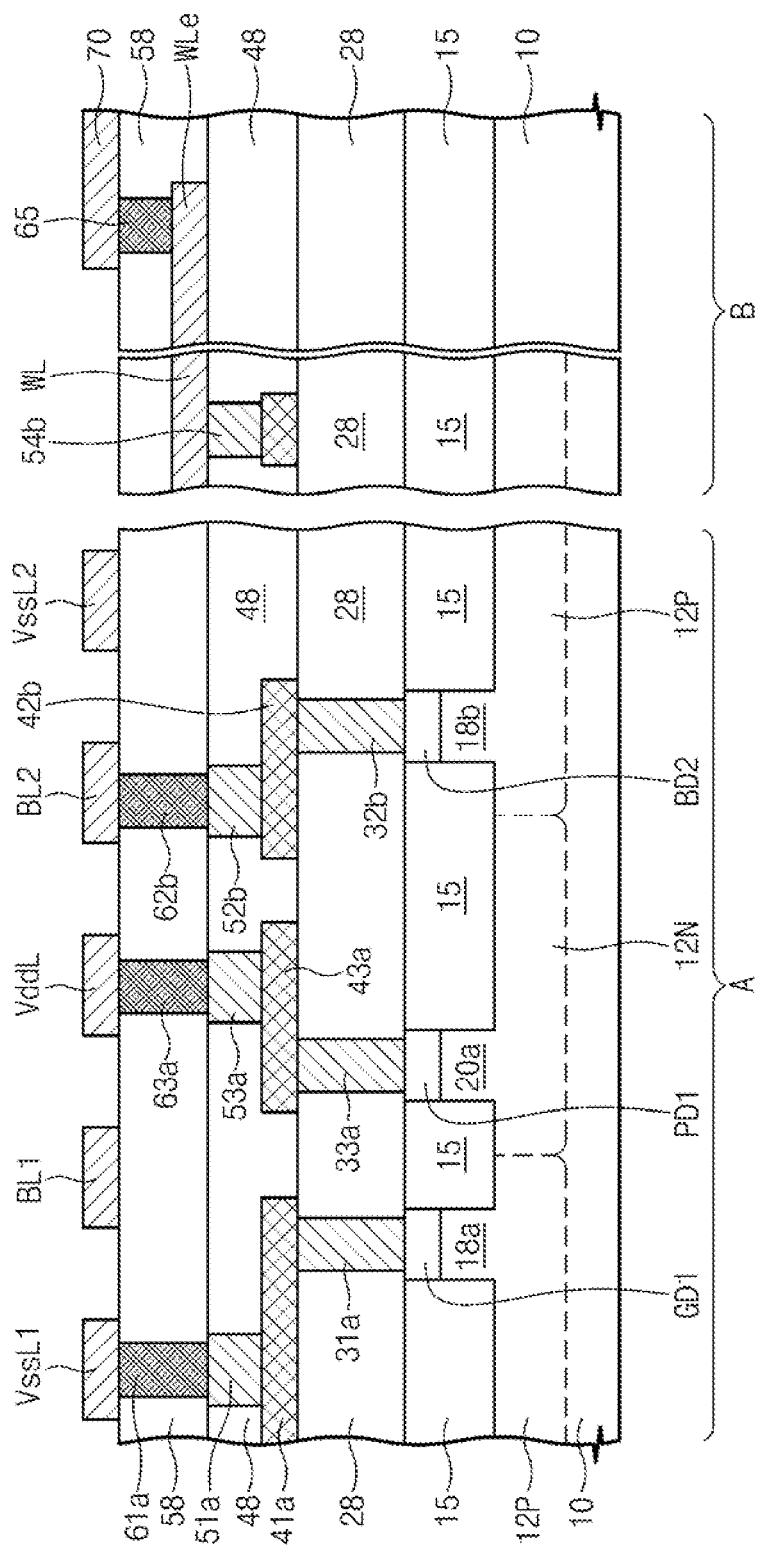

Referring to FIGS. 7a, 7b and 7c, a first ground line VssL1, a first bit line BL1, a power line VddL, a second bit line BL2 and a second ground line VssL2 may be formed on the second interlayer dielectric layer 58. The first ground line VssL1, the first bit line BL1, the power line VddL, the second bit line BL2 and the second ground line VssL2 may be disposed at the same level from the top surface of the substrate 10, which is different from the level where the word line WL may be disposed. The word line may be disposed on a lower level than the first ground line VssL1, the first bit line BL1, the power line VddL, the second bit line BL2 and the second ground line VssL2.

The first ground line VssL1 is connected to the first ground via plug 61a and the first bit line BL1 is connected to the first bit via plug 62a. The second ground line VssL2 is connected to the second ground via plug 61b, and the second bit line BL2 is connected to the second bit via plug 62b. The power line VddL connects the first and second via plugs 63a and 63b.

The first and the second bit lines BL1 and BL2 may be disposed between the first ground line VssL1 and the second ground line VssL2, and the power line VddL may be disposed between the first bit line BL1 and the second bit line BL2. The first ground line, the first bit line, the power line, the second bit line and the second ground line VssL1, BL1, VddL, BL2 and VssL2 may be spaced apart by substantially the same interval and extend in parallel with the minor axis of the rectangular shaped SRAM cell array region 90 of FIG. 1 corresponding to the y-axis.

An upper interconnection 70 may be formed on the second interlayer dielectric layer 58. The upper interconnection 70 may be disposed spaced apart from the first ground line, the first bit line, the power line, the second bit line and the second ground line VssL1, BL1, VddL, BL2 and VssL2. The upper interconnection 70 may be disposed over an end WLe of the word line WL and extend out of the SRAM cell array region 90 of FIG. 1.

The first ground line, the first bit line, the power line, the second bit line and the second ground line VssL1, BL1, VddL, BL2 and VssL2 may be formed after the via plugs 61a, 62a, 63a, 61b, 62b, 63b and 65 are formed, and along with the upper interconnection 70, may be include material with a low resistivity. For example, the first ground line, the first bit line, the power line, the second bit line and the second ground line VssL1, BL1, VddL, BL2 and VssL2 and the upper interconnection 70 may include aluminum, alloyed aluminum, copper and/or alloyed copper. In addition, the first ground line, the first bit line, the power line, the second bit line and the second ground line VssL1, BL1, VddL, BL2 and VssL2 and the upper interconnection 70 may further include a conductive metal nitride (e.g., titanium nitride, tantalum nitride, etc.) and/or an adhesive layer (e.g., titanium, tantalum, etc.) used as a barrier metal.

Semiconductor devices according to embodiments of the inventive concept include an SRAM cell having the ground lines VssL1 and VssL2, the bit lines BL1 and BL2 and the power line disposed at the same level and extending in parallel with each other. Thus, a ground voltage and an operation voltage can be uniformly supplied through the ground lines VssL1 and VssL2 and the bit lines BL1 and BL2, respectively. Therefore, reliability of the SRAM cell operation can be improved.

In addition, the via plugs 61a, 62a, 63a, 61b, 62b and 63b disposed under the ground lines VssL1 and VssL2, the bit lines BL1 and BL2 and the power line VddL are respectively connected to the landing plugs 51a, 52a, 53a, 51b, 52b and 53b. Thus, the plane area occupied by the word lines WL can be minimized to minimize the plane area of the SRAM cell to form a highly integrated semiconductor device.

Further, if an SRAM cell array region has a rectangular shape, the ground lines VssL1 and VssL2, the bit lines BL1 and BL2 and the power line VddL may extend in parallel with the minor axis of the SRAM cell array region. Thus, a length of each of the ground lines VssL1 and VssL2, the bit lines BL1 and BL2 and the power line VddL can be minimized to reduce the resistivity of each of the ground lines VssL1 and VssL2, the bit lines BL1 and BL2 and the power line VddL. Therefore, the operating speed as well as the reliability of the SRAM cells can be improved.

A semiconductor device according to embodiments of the inventive concept may be formed into the variety of semiconductor packages. For example, the semiconductor device may be packaged into a PoP (Package on Package), a BGA (Ball grid array), a CSP (Chip Scale Package), a PDIP (Plastic Dual In-line Package), a Die in Waffle Pack, a Die in Wafer Form, a COB (Chip On Board), a CERDIP (Ceramic Dual In-line Package), an MQFP (Plastic Metric Quad Flat Pack), a TQFP (Thin Quad Flat Pack), a SOIC (Small Outline), a SSOP (Shrink Small Outline Package), a TSOP (Thin Small Outline), a TQFP (Thin Quad Flat Pack), an SIP (System In Package), an MCP (Multi Chip Package), a WFP (Wafer-level Fabricated Package), a WSP (Wafer-level Processed Stack Package, etc.

Figure 8:
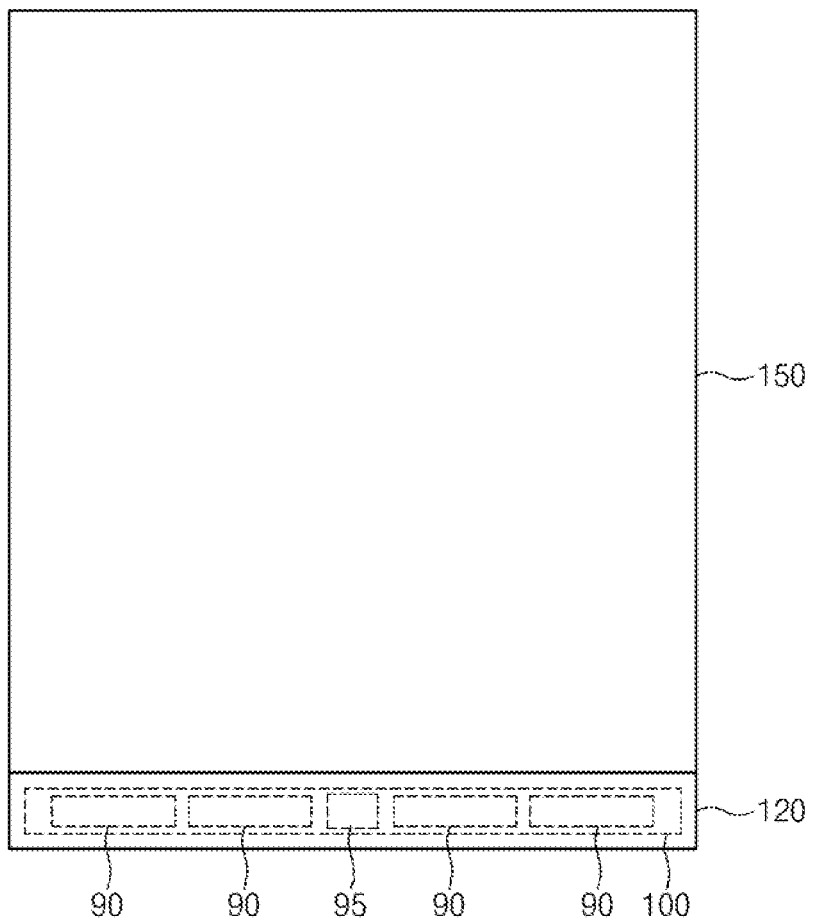
FIG. 8 is a plan view illustrating an electronic appliance which includes a semiconductor device according to embodiments of the inventive concept.

FIG. 8 is a plan view illustrating an electronic appliance which includes a semiconductor device according to embodiments of the inventive concept.

Referring to FIG. 8, an electronic appliance 200 may include a display device 150 and a driver module 120 connected on a side of the display device 150. The driver module 120 may include a semiconductor device 100 according to an embodiment of the inventive concept. The semiconductor device 100 may be a display driver IC (Integrated Circuit). The semiconductor device may include a plurality of SRAM cells 90 and a logic region 95. The semiconductor device 100 may be packaged into the above package types and embedded in the driver module 120. The electronics appliance 200 may be a PDA (Personal Digital Assistant), a portable computer, a web tablet, a wireless phone or a mobile phone.

According to embodiments of the inventive concept, the power line, the ground line and the bit line are disposed at substantially the same level while extending in a first direction. Thus, the power supply voltage to the power line, the ground voltage to the ground line and the operating voltage to the bit line can be uniformly supplied, thereby improving reliability of SRAM cells operation.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor device including an SRAM cell, said SRAM cell comprising:
a first load transistor, a first driver transistor and a first access transistor on a substrate, each of said first load, first driver, and first access transistors having a first source/drain and a second source/drain, wherein said first source/drains are connected to a first node;
a power line, a first ground line and a first bit line respectively connected to said second source/drains of said first load, first driver and first access transistors, wherein the power line, the first ground line and the first bit line are disposed at substantially a same level to extend in a first direction;
a word line connected to a gate of the first access transistor that extends in a second direction perpendicular to the first direction, wherein the word line is disposed at a level that differs from that of the power line, the first ground line and the first bit line;
a first interlayer dielectric layer on the first load transistor, the first driver transistor and the first access transistor;
a second interlayer dielectric layer disposed on the first interlayer dielectric layer;
a first power landing plug, a first ground landing plug and a first bit landing respectively connected through the first interlayer dielectric layer to the second source/drain of the first load transistor, the second source/drain of the first driver transistor and the second source/drain of the first access transistor; and
a first power via plug, a first ground via plug and a first bit via plug respectively connected through the second interlayer dielectric layer to the first power landing plug, the first ground landing plug and the first bit landing plug,
wherein the word line is disposed between the first interlayer dielectric layer and the second interlayer dielectric layer,
the power line, the first ground line and the first bit line are disposed on the second interlayer dielectric layer,
the first power via plug, the first ground via plug and the first bit via plug are respectively connected to the power line, the first ground line and the first bit line, and
bottom surfaces of the first power via plug, the first ground via plug and the first bit via plug are narrower than top surfaces of the first power landing plug, the first ground landing plug and the first bit landing plug, respectively.

2. The semiconductor device of claim 1, further comprising:
a first lower via plug connected to the word line and electrically coupled through the first interlayer dielectric layer to the gate of the first access transistor.

3. The semiconductor device of claim 2, further comprising:
a first NMOS active region and a first PMOS active region defined by a device isolation pattern disposed on the substrate;
a first sharing gate crossing over the first NMOS active region and the first PMOS active region;
a first access gate crossing over the first NMOS active region along side of the first sharing gate;
a first n-type node doped region formed in the first NMOS active region between the first sharing gate and the first access gate;
a first power doped region and a first p-type node doped region formed in the first PMOS active region along both sides of the first sharing gate, respectively;
a first ground doped region formed in the first NMOS active region along side of the first sharing gate; and
a first bit doped region formed in the first NMOS active region along side of the first access gate, wherein
the first driver transistor includes the first n-type node doped region, the first ground doped region, and the first sharing gate crossing over the first NMOS active region,
the first load transistor includes the first p-type node doped region, the first power doped region, and the first sharing gate crossing over the first PMOS active region, and
the first access transistor includes the first n-type node doped region, the first bit doped region, the first access gate crossing over the first NMOS active region along side of the first sharing gate.

4. The semiconductor device of claim 3, further comprising:
a lower dielectric layer on the first load transistor, the first driver transistor and the first access transistor;

a first power contact plug, a first ground contact plug and a first bit contact plug respectively connected through the lower dielectric layer to the first power doped region, the first ground doped region and the first bit doped region;

a first gate contact plug connected through the lower dielectric layer to the first access gate;

a first p-type node contact plug and a first n-type node contact plug respectively connected through the lower dielectric layer to the first p-type node doped region and the first n-type node doped region;

a first power pad pattern, a first ground pad pattern, a first bit pad pattern and a first gate pad pattern disposed on the lower dielectric layer and respectively connected to the first power, first ground, first bit and first gate contact plugs; and a first node interconnection disposed on the lower dielectric layer and connected to the first p-type node and first n-type node contact plugs, wherein the first interlayer dielectric layer is disposed on the lower dielectric layer, the first pad patterns and the first node interconnection, the first power, ground and bit landing plugs are respectively connected to the first power, ground and bit pad patterns, and the first lower via plug is connected to the first gate pad pattern.

5. The semiconductor device of claim 2, further comprising:

an upper via plug connected through the second interlayer dielectric layer to an edge of the word line; and an upper interconnection disposed on the second interlayer dielectric layer, connected to the upper via plug, and disposed away from the power line, the ground line and the bit line.

6. The semiconductor device of claim 1, further comprising:

a second load transistor, a second driver transistor and a second access transistor on the substrate, each of said second load, second driver, and second access transistors having a first source/drain and a second source/drain, wherein said first source/drains are connected to a second node; and a second ground line and a second bit line extending in the first direction and electrically connected to the second source/drains of the second driver transistor and the second access transistor, respectively, wherein the second ground line and the second bit line are disposed at substantially the same level as the power line, the first ground line and the first bit line, and the second access transistor includes a gate electrically connected to the word line, and the second source/drain of the second load transistor is electrically connected to the power line.

7. The semiconductor device of claim 6, wherein the first load transistor and the first driver transistor each include a gate electrically connected to the second node, and the second load transistor and the second driver transistor each include a gate electrically connected to the first node.

8. The semiconductor device of claim 6, wherein the first interlayer dielectric layer is on the second load transistors, the second driver transistors and the second access transistors; and the second ground line and the second bit line are disposed on the second interlayer dielectric layer.

9. The semiconductor device of claim 8, further comprising:

a second power landing plug, a second ground landing plug and a second bit landing plug electrically connected through the first interlayer dielectric layer to the second source/drain of the second load transistor, the second source/drain of the second driver transistor and the second source/drain of the second access transistor, respectively; and a second power via plug, a second ground via plug and a second bit via plug respectively connected through the second interlayer dielectric layer to the second power landing plug, the second ground landing plug and the second bit landing plug, wherein the second power via plug, the second ground via plug and the second bit via plug are respectively connected to the power line, the second ground line and the second bit line, and bottom surfaces of the second power via plug, the second ground via plug and the second bit via plug are narrower than top surfaces of the second power landing plug, the second ground landing plug and the second bit landing plug, respectively.

10. The semiconductor device of claim 6, wherein the first bit line and the second bit line are disposed between the first ground line and the second ground line, and the power line is disposed between the first bit line and the second bit line.

11. The semiconductor device of claim 1, wherein the substrate comprises a plurality of SRAM cells arranged in an SRAM array region, and the SRAM cell array region has a rectangular shape of which the minor axis corresponds to the first direction and the major axis corresponds to the second direction.

12. A semiconductor device including an SRAM cell, said SRAM cell comprising:

a first load transistor, a first driver transistor and a first access transistor on a substrate, each of said first load, first driver, and first access transistors having a first source/drain and a second source/drain, wherein said first source/drains are connected to a first node;

a power line, a first ground line and a first bit line respectively connected to said second source/drains of said first load, first driver and first access transistors, wherein the power line, the first ground line and the first bit line are disposed at substantially a same level to extend in a first direction;

a first interlayer dielectric layer on the first load transistor, the first driver transistor and the first access transistor;

a second interlayer dielectric layer disposed on the first interlayer dielectric layer;

a first power landing plug, a first ground landing plug and a first bit landing plug respectively connected through the first interlayer dielectric layer to the second source/drain of the first load transistor, the second source/drain of the first driver transistor and the second source/drain of the first access transistor; and a first power via plug, a first ground via plug and a first bit via plug respectively connected through the second interlayer dielectric layer to the first power landing plug, the first ground landing plug and the first bit landing plug, wherein the power line, the first ground line and the first bit line are disposed on the second interlayer dielectric layer, the first power via plug, the first ground via plug and the first bit via plug are respectively connected to the power line, the first ground line and the first bit line, and bottom surfaces of the first power via plug, the first ground via plug and the first bit via plug are narrower than top surfaces of the first power landing plug, the first ground landing plug and the first bit landing plug, respectively.

\* \* \* \* \*